(12) United States Patent
Litfin et al.

(10) Patent No.: US 6,307,490 B1
(45) Date of Patent: Oct. 23, 2001

(54) DIGITAL TO ANALOG CONVERTER TRIM APPARATUS AND METHOD

(75) Inventors: Helmuth Robert Litfin; Anthony Joseph Becker, both of San Jose; Clyde Manford Brown, Cupertino, all of CA (US)

(73) Assignee: The Engineering Consortium, Inc., Santa Clara, CA (US)

( * ) Notice: Subject to any disclaimer, the term of this patent is extended or adjusted under 35 U.S.C. 154(b) by 0 days.

(21) Appl. No.: 09/410,111

(22) Filed: Sep. 30, 1999

(51) Int. Cl.[7] ................................................. H03M 1/10
(52) U.S. Cl. ................................. 341/121; 341/144
(58) Field of Search ............................. 341/121, 118, 341/120, 144, 115, 154, 153, 138

(56) References Cited

U.S. PATENT DOCUMENTS

| | | | |
|---|---|---|---|
| 4,062,013 | 12/1977 | Nagahama | 340/347 |
| 4,097,753 | * 6/1978 | Cook et al. | 307/359 |
| 4,099,174 | 7/1978 | Svensson | 340/347 |
| 4,138,671 | * 2/1979 | Comer et al. | 340/347 |
| 4,363,024 | * 12/1982 | Brokaw | 340/347 |
| 4,673,917 | 6/1987 | Urschel et al. | 340/347 |
| 5,087,914 | 2/1992 | Sooch et al. | 341/120 |
| 5,218,362 | 6/1993 | Mayes et al. | 341/121 |
| 5,298,898 | 3/1994 | Brunheim | 341/118 |
| 5,602,925 | 2/1997 | Killion | 381/68.4 |
| 5,608,347 | * 3/1997 | Kearney | 327/512 |
| 5,666,118 | 9/1997 | Gersbach | 341/120 |
| 5,825,317 | * 10/1998 | Anderson et al. | 341/120 |

OTHER PUBLICATIONS

Product Information—"Advance Information, CAT514, 8–Bit Quad Digital POT," Catalyst Semiconductor, Inc., Doc. No. 25075–00, 2/98, M–1, pp. 1–12.
Production Information—"Low Noise/Low Power, X9258, Quad Non–Volatile Digital Potentiometer," XICOR, 9900–2006.1, Jun. 9, 1999 PS, pp. 1–19.

* cited by examiner

*Primary Examiner*—Peguy JeanPierre
(74) *Attorney, Agent, or Firm*—Coudert Brothers

(57) ABSTRACT

A digital to analog converter has a decoder configured to select weighted decoding elements in a decoding network. The decoded outputs increase in steps by a mathematical progression as a function of the value of the input to the decoder. A calibration circuit adjusts the value of the digital input code received by the decoder to achieve a calibration function. In a programmable resistor embodiment, the value of the resistance selected by subsequent digital codes increases by a constant ratio. An adder is used to add an offset value to the digital input, thereby shifting the value of the resistance selected by the decoder to compensate for fabrication variances. A three terminal embodiment suitable for a form-C switch has a shorting switch to permit the programmable resistor to be switched from an extremely high resistance to an extremely low resistance

28 Claims, 20 Drawing Sheets

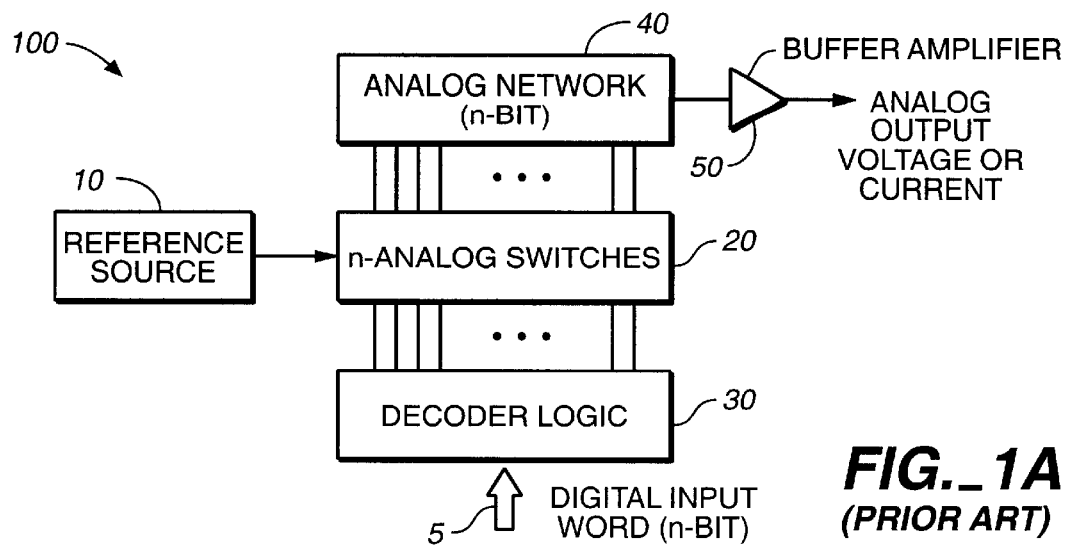
FIG._1A
(PRIOR ART)
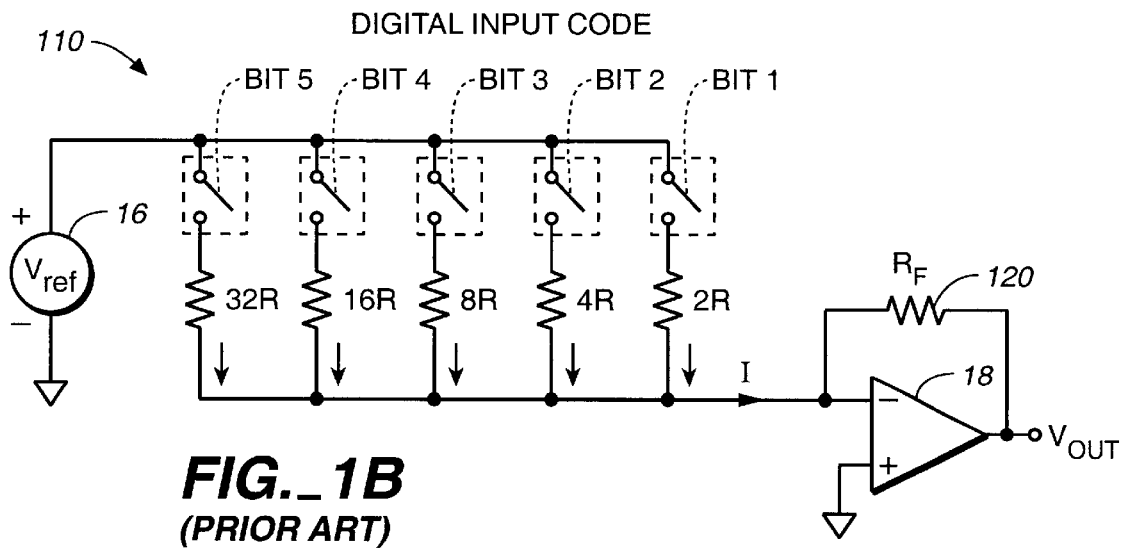
FIG._1B
(PRIOR ART)
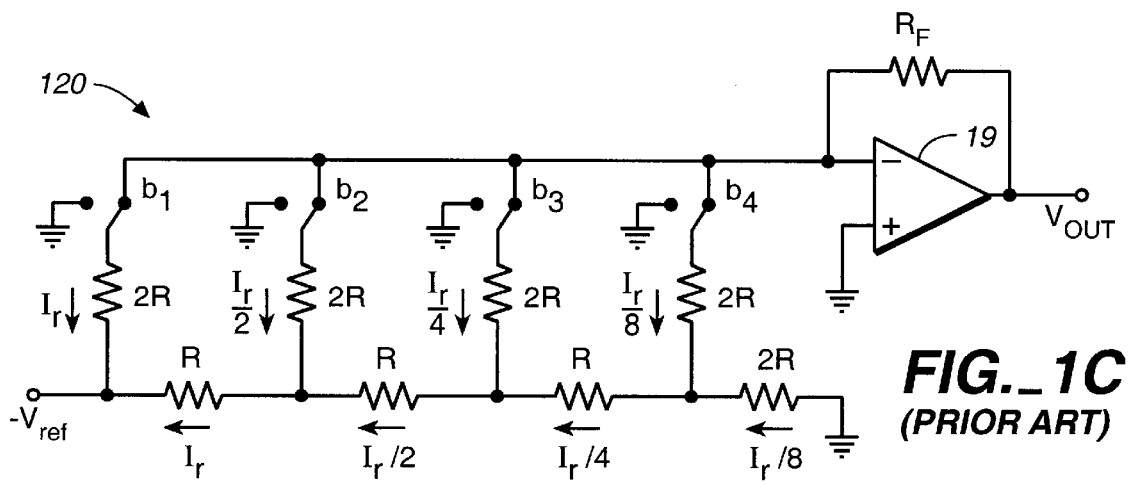
FIG._1C
(PRIOR ART)

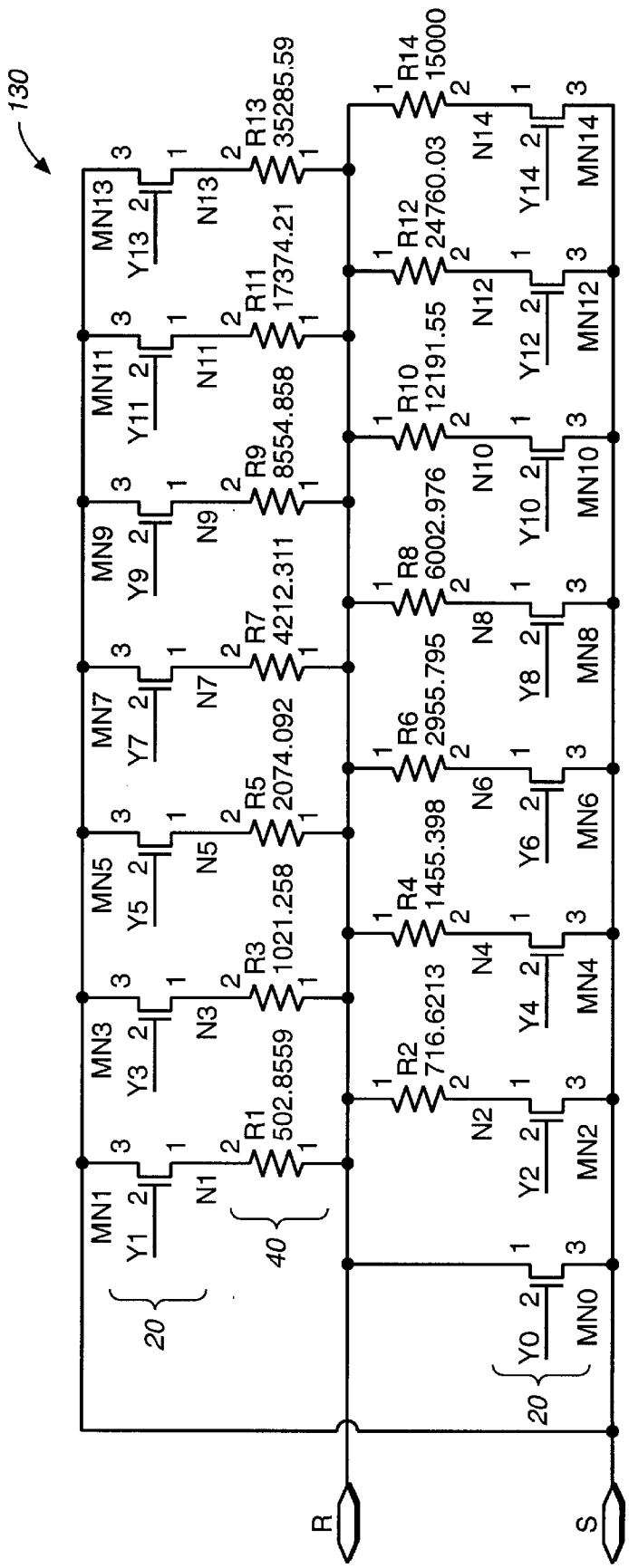
FIG._1D-1
(PRIOR ART)

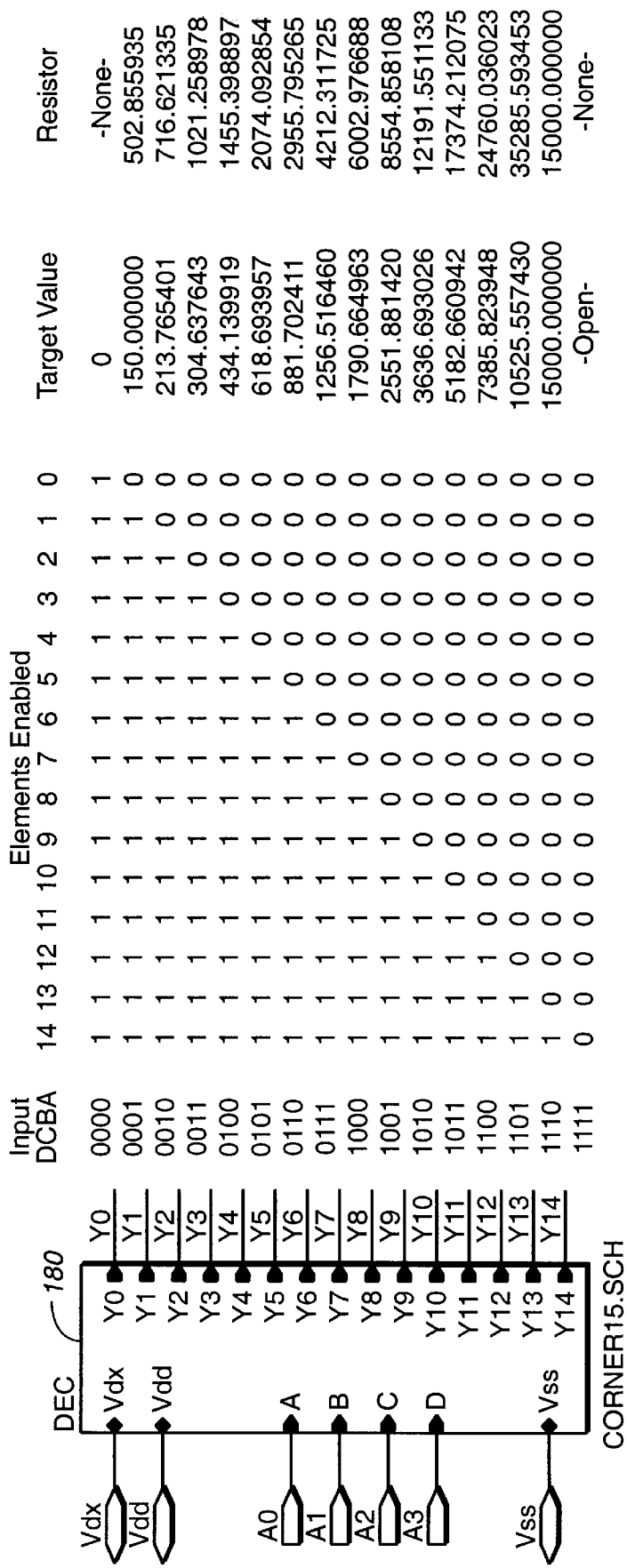
FIG._1D-2 (PRIOR ART)

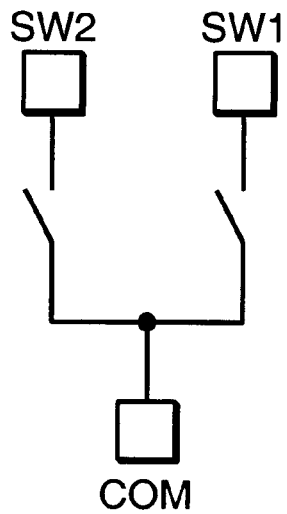
FIG._2A
*(PRIOR ART)*
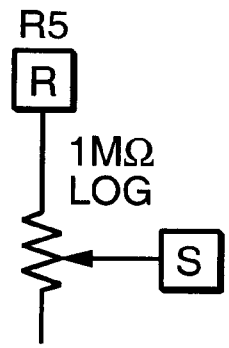
FIG._2B
*(PRIOR ART)*
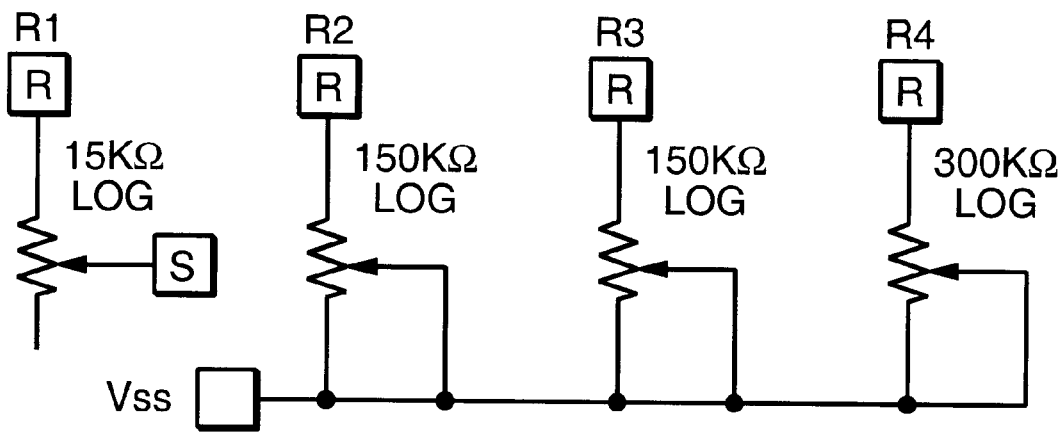
FUNCTIONAL SCHEMATIC DIAGRAM
FIG._2C
*(PRIOR ART)*

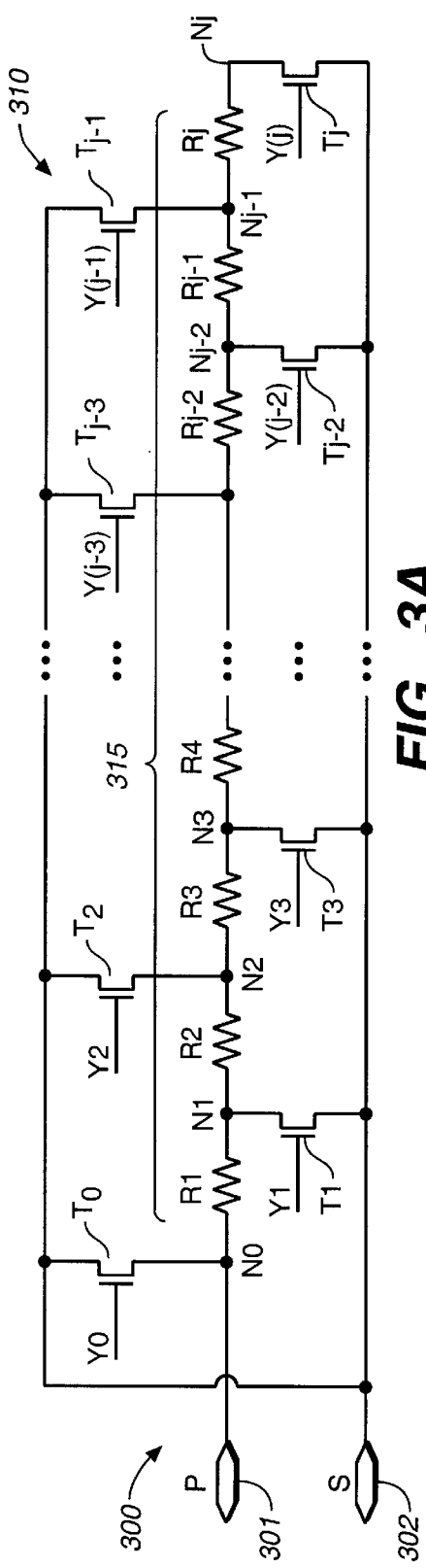
FIG._3A
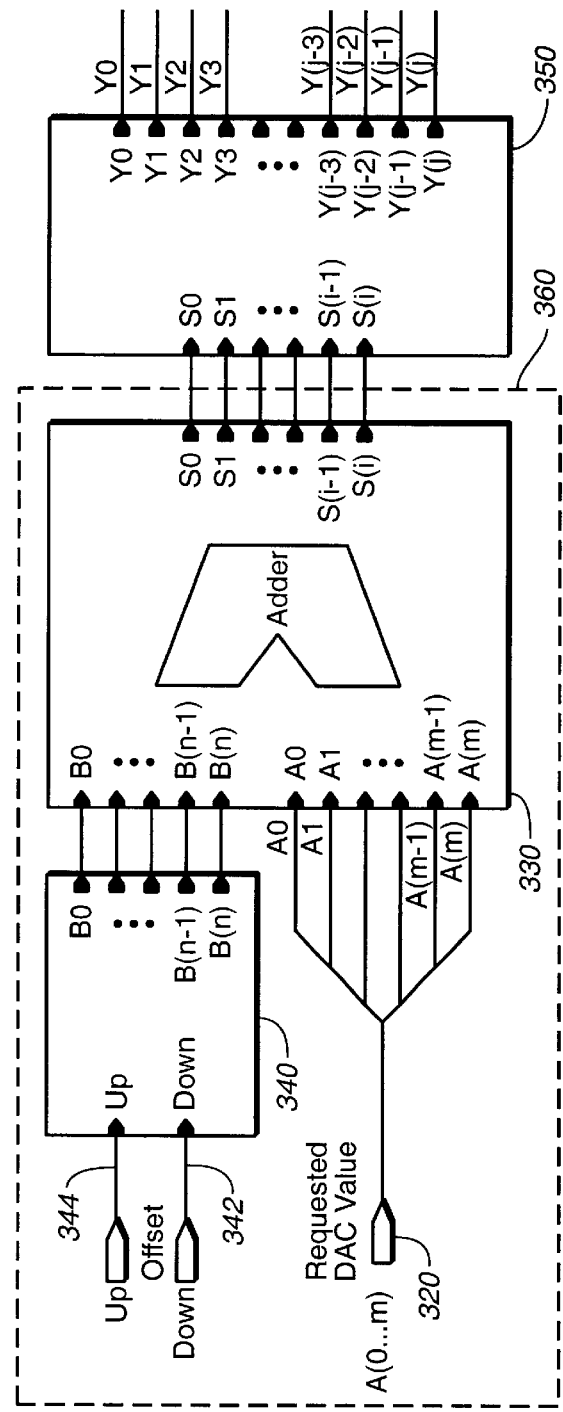
FIG._3B

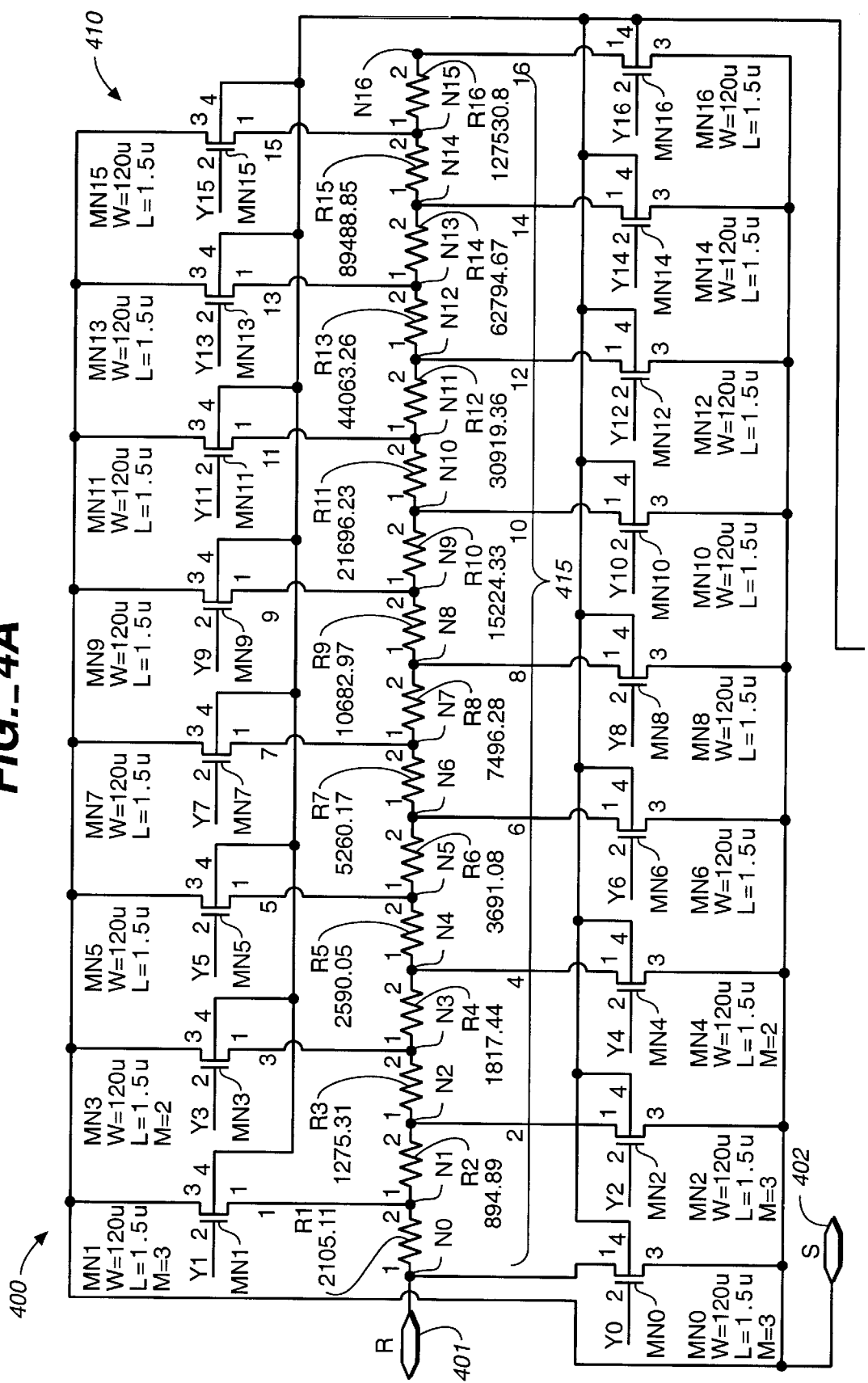
FIG._4A

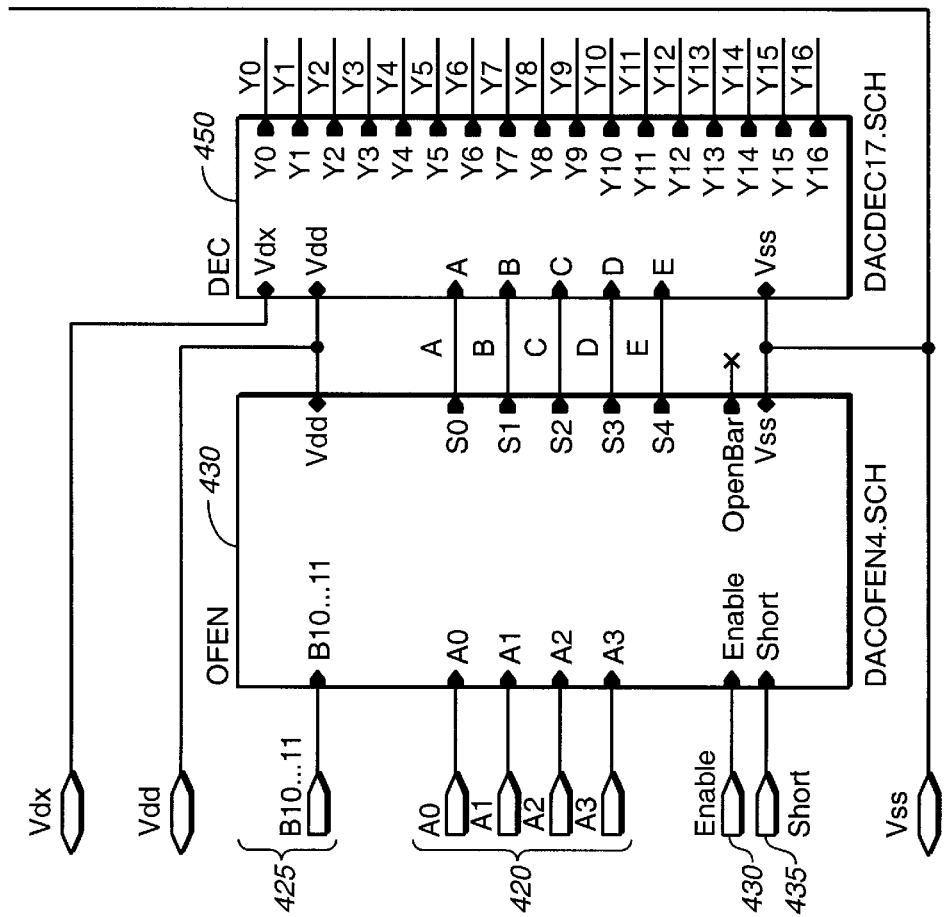
| Resistor Number | Resistor Value | Series Value |
|---|---|---|
| 1 (0) | 2105.111486 | 2105.111486 |
| 2 (1) | 894.888514 | 3000.0 |
| 3 (2) | 1275.308011 | 4275.308011 |
| 4 (3) | 1817.444852 | 6092.752863 |
| 5 (4) | 2590.045511 | 8682.798374 |
| 6 (5) | 3691.080775 | 12373.879149 |
| 7 (6) | 5260.169068 | 17634.048217 |
| 8 (7) | 7496.280985 | 25130.329202 |
| 9 (8) | 10682.970049 | 35813.299251 |
| 10 (9) | 15224.329144 | 51037.628396 |
| 11 (10) | 21696.232117 | 72733.860512 |
| 12 (11) | 30919.358325 | 103653.218838 |
| 13 (12) | 44063.260113 | 147716.478951 |
| 14 (13) | 62794.66965 | 210511.148601 |
| 15 (14) | 89488.851399 | 300000.0 |
| 16 (15) | 127530.801091 | 427530.801091 |
FIG._4
FIG._4B

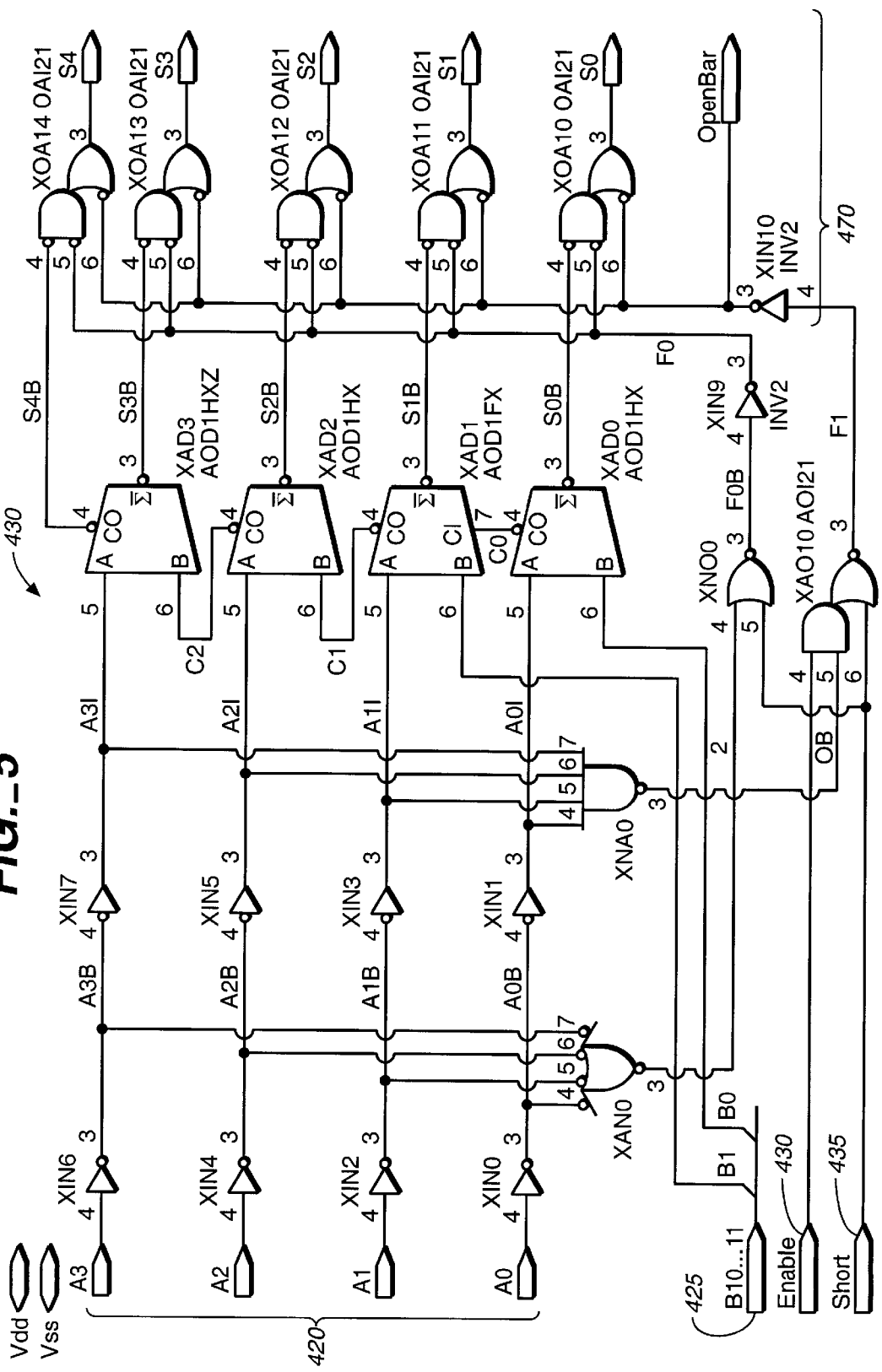
FIG._5

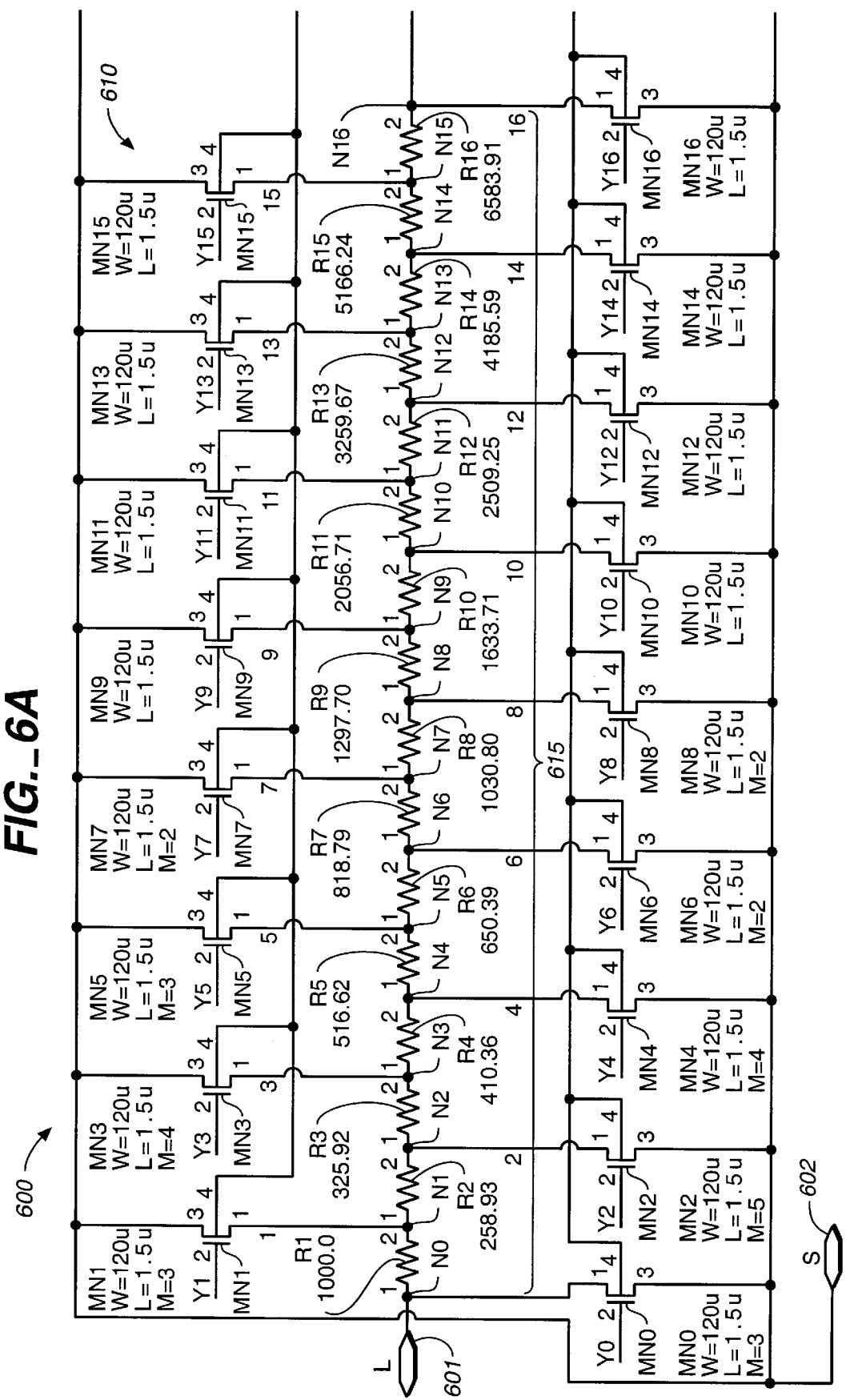
FIG._6A

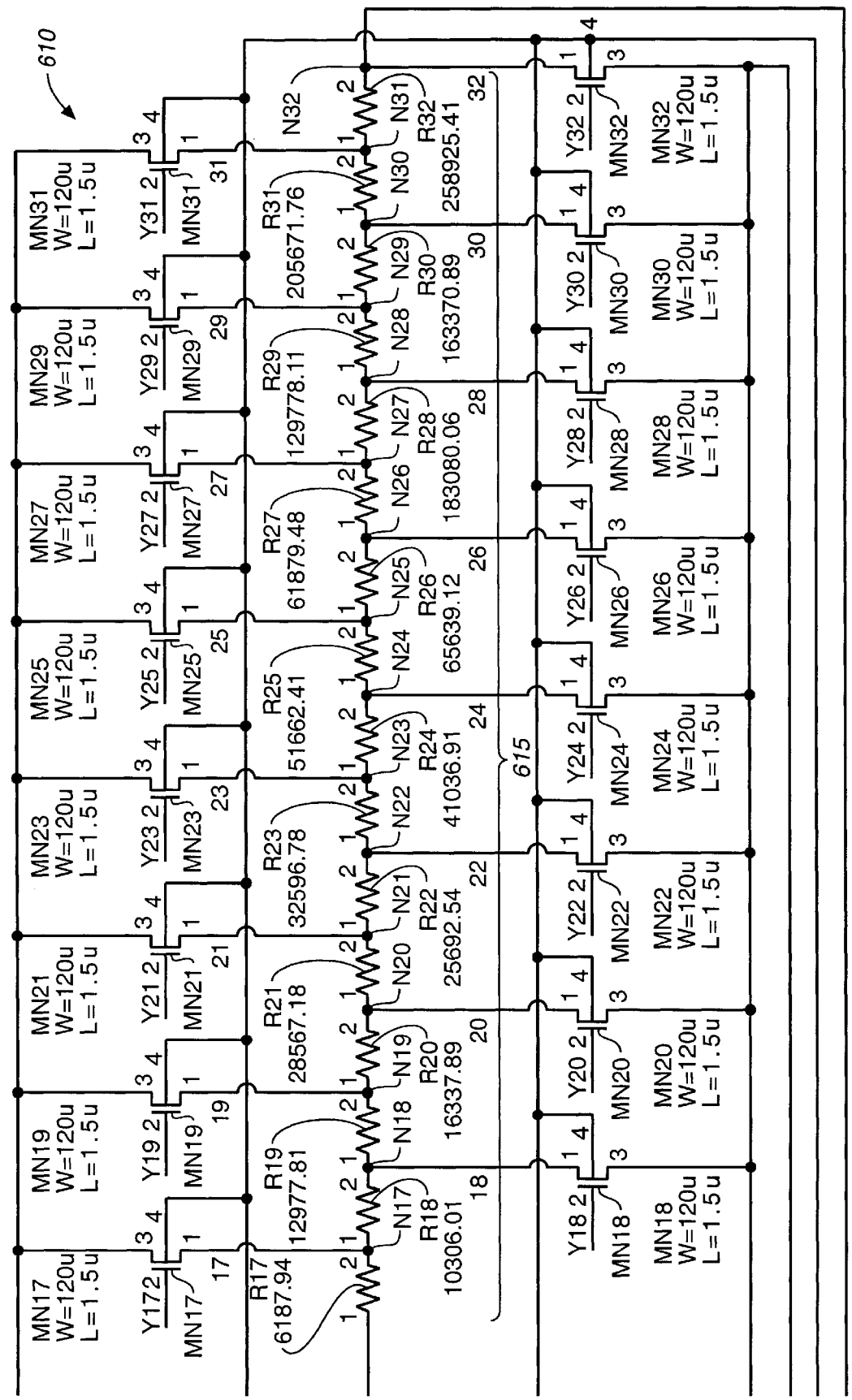
FIG._6B

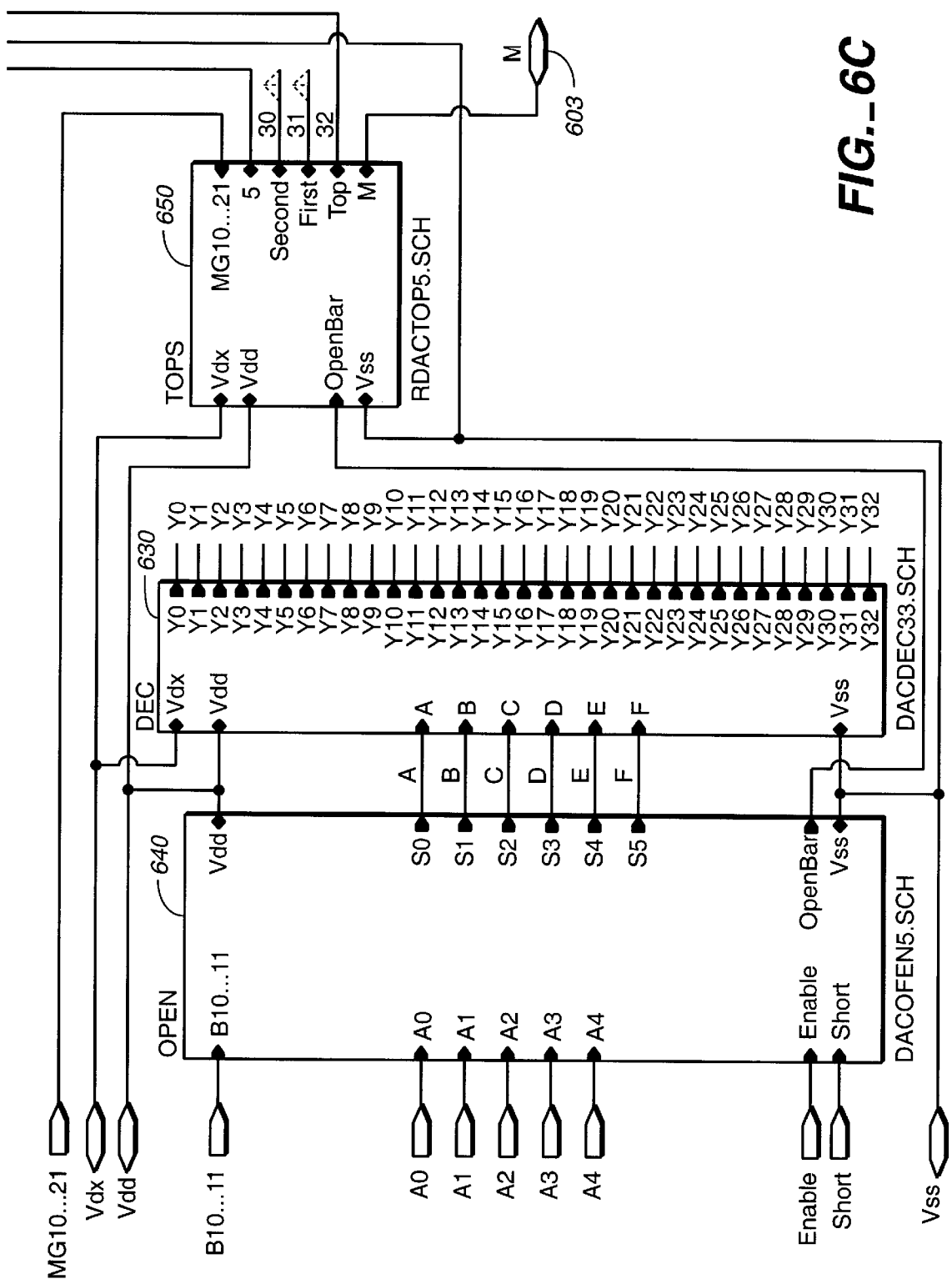
FIG._6C

FIG._6D

| Resistor Number | Resistor Value | Series Value |
|---|---|---|
| 1 (0) | 1000.0 | 1000.0 |
| 2 (1) | 258.925412 | 1250.925412 |
| 3 (2) | 325.967781 | 1584.893192 |
| 4 (3) | 410.369123 | 1995.262315 |
| 5 (4) | 516.824117 | 2511.886432 |
| 6 (5) | 650.391229 | 3162.27766 |
| 7 (6) | 818.794045 | 3981.871786 |
| 8 (7) | 1030.800631 | 5011.872336 |
| 9 (8) | 1297.701109 | 6309.573445 |
| 10 (9) | 1633.706902 | 7943.282347 |
| 11 (10) | 2056.717653 | 19800.0 |
| 12 (11) | 2509.254118 | 12589.254118 |
| 13 (12) | 3259.677807 | 15848.331925 |
| 14 (13) | 4103.891225 | 19952.62315 |
| 15 (14) | 5166.241165 | 25118.664315 |
| 16 (15) | 6503.912287 | 31622.776602 |
| 17 (16) | 6187.940454 | 39810.717055 |
| 18 (17) | 10306.006307 | 50118.723363 |
| 19 (18) | 12977.811085 | 63095.734448 |
| 20 (19) | 16337.889624 | 79432.623472 |
| 21 (20) | 28567.176528 | 100000.0 |
| 22 (21) | 25692.541179 | 125892.541179 |
| 23 (22) | 32596.778067 | 150485.319246 |
| 24 (23) | 41036.912251 | 199526.231497 |
| 25 (24) | 51662.411654 | 251186.643151 |
| 26 (25) | 65639.122666 | 316227.766617 |
| 27 (26) | 61879.484537 | 398107.178553 |
| 28 (27) | 183080.063874 | 501167.233627 |
| 29 (28) | 129778.110853 | 638957.34448 |
| 30 (29) | 163370.898244 | 794328.234724 |
| 31 (30) | 205671.765276 | 1000000.0 |
| 32 (31) | 258925.411794 | 1258925.411794 |

FIG._6

| FIG._6A | FIG._6B |
|---|---|
| FIG._6C | FIG._6D |

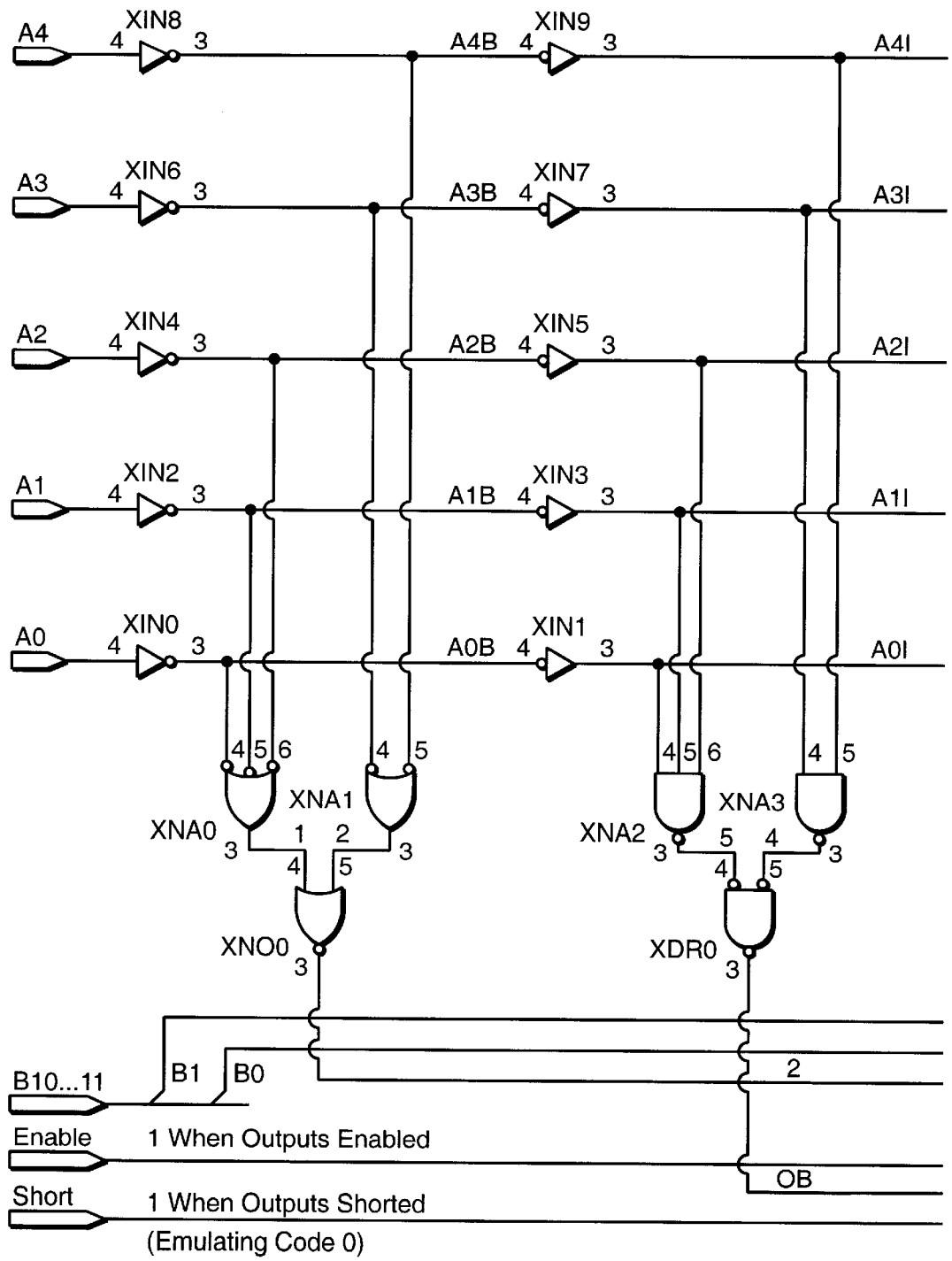
FIG._7A

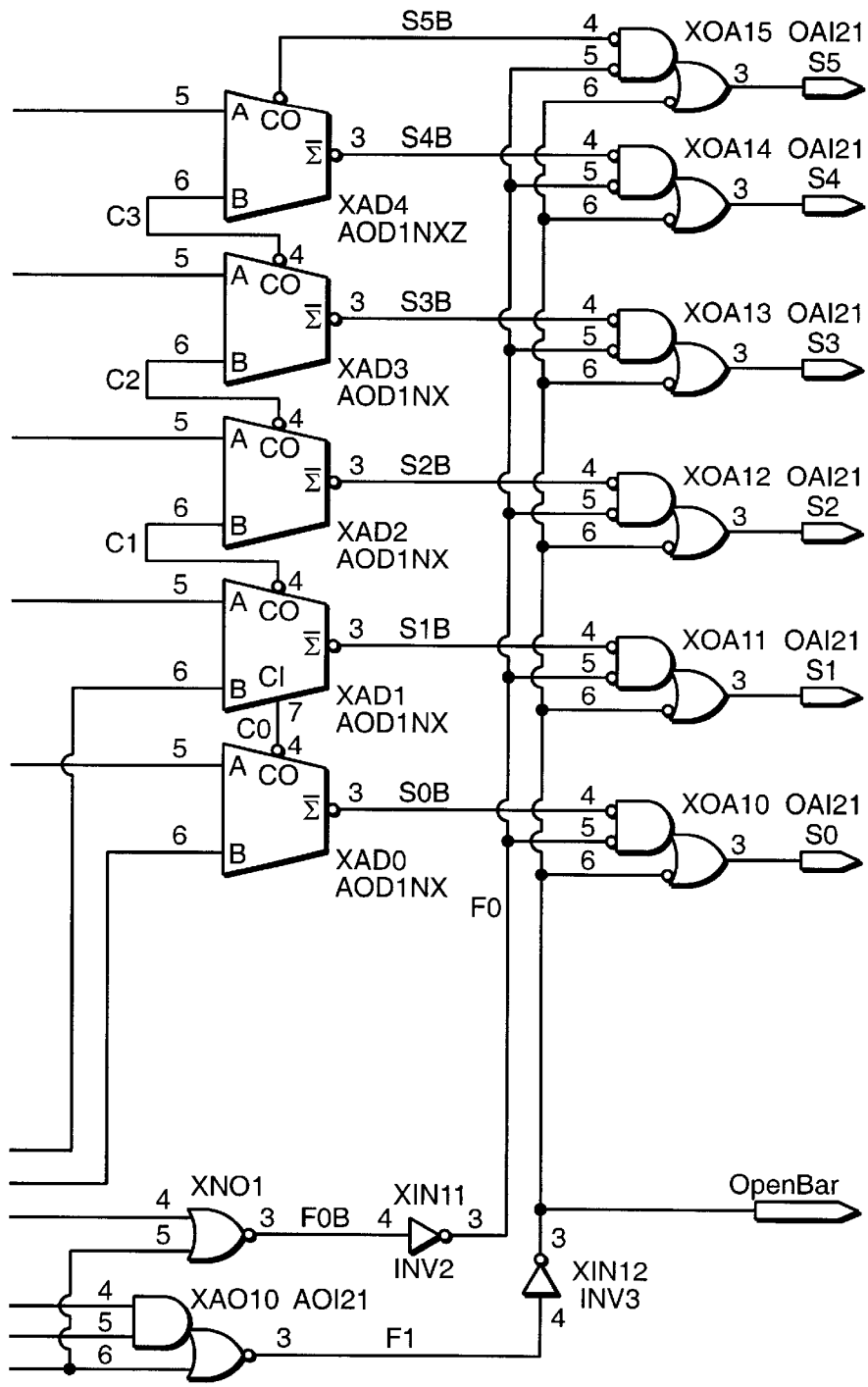
FIG._7B
FIG._7   FIG._7A | FIG._7B

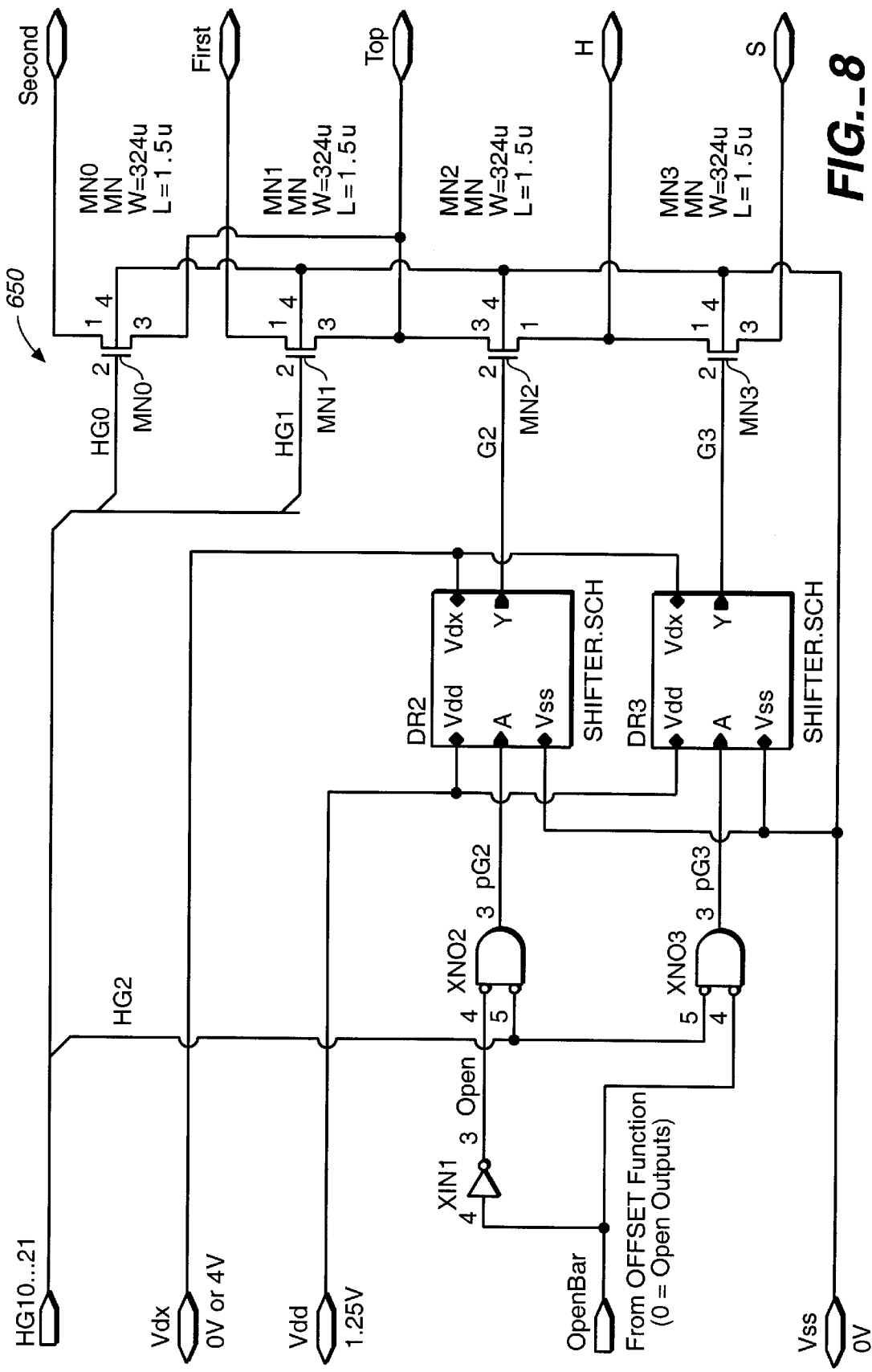
FIG._8

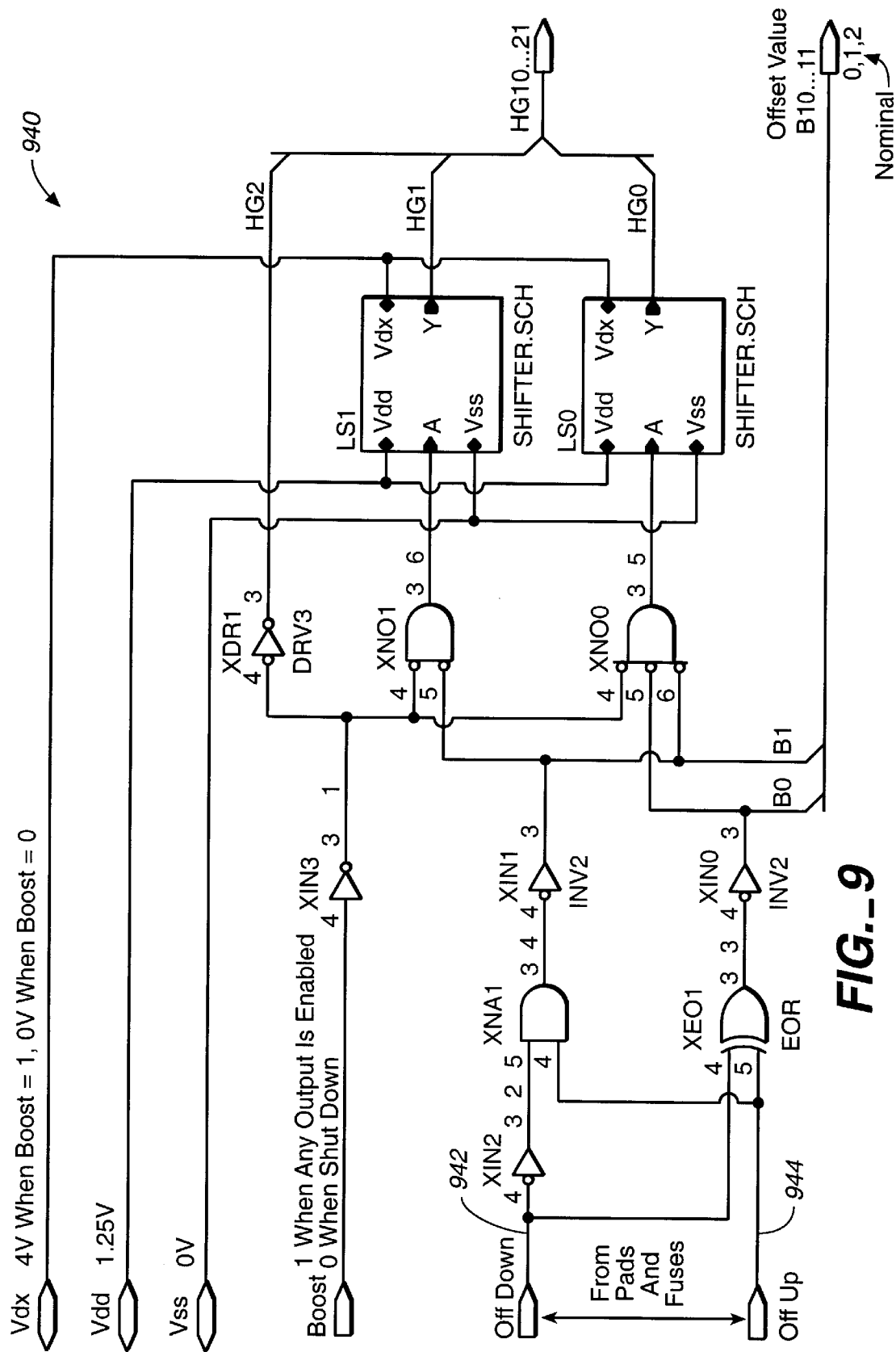
FIG._9

OffU/OffD Truth Table         ("V" = Vdx)
| Inputs | | Outputs | | | | Shift |
|---|---|---|---|---|---|---|
| OffU | OffD | B1 | B0 | HG1 | HG0 | |
| 0 | 0 | 0 | 1 | V | 0 | 1 |
| 0 | 1 | 0 | 0 | V | V | 0 |
| 1 | 0 | 1 | 0 | 0 | 0 | 2 |
| 1 | 1 | 0 | 1 | V | 0 | 1 |
FIG._10
RDAC "H" Gates Truth Table         ("V" = Vdx)
| Inputs | | | Outputs | | | | "H" Connections |
|---|---|---|---|---|---|---|---|
| Boost | Shift | Code | HG0 | HG1 | G2 | G3 | |
| 0 | X | X | 0 | 0 | 0 | 0 | *Open* |
| 1 | 0 | 0/n | V | V | V | 0 | H - Top - First - Second |
| 1 | 0 | Open | V | V | 0 | V | H - S |
| 1 | 1 | 0/n | 0 | V | V | 0 | H - Top - First |
| 1 | 1 | Open | 0 | V | 0 | V | H - S |
| 1 | 2 | 0/n | 0 | 0 | V | 0 | H - Top |
| 1 | 2 | Open | 0 | 0 | 0 | V | H - S |
FIG._11
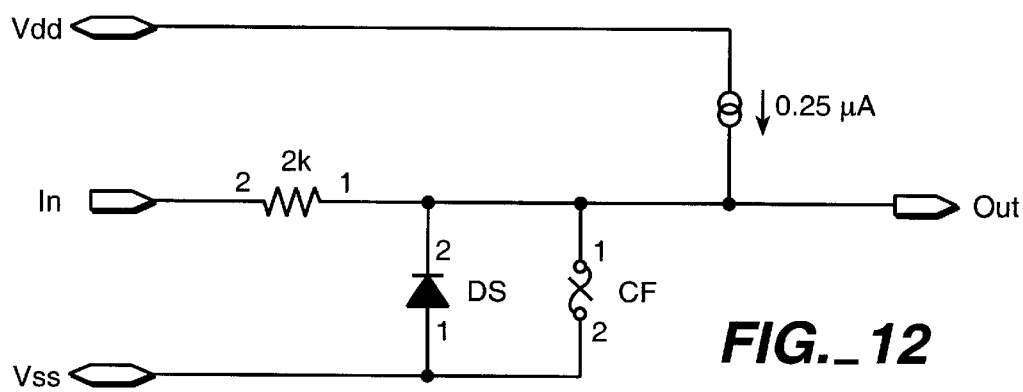
FIG._12

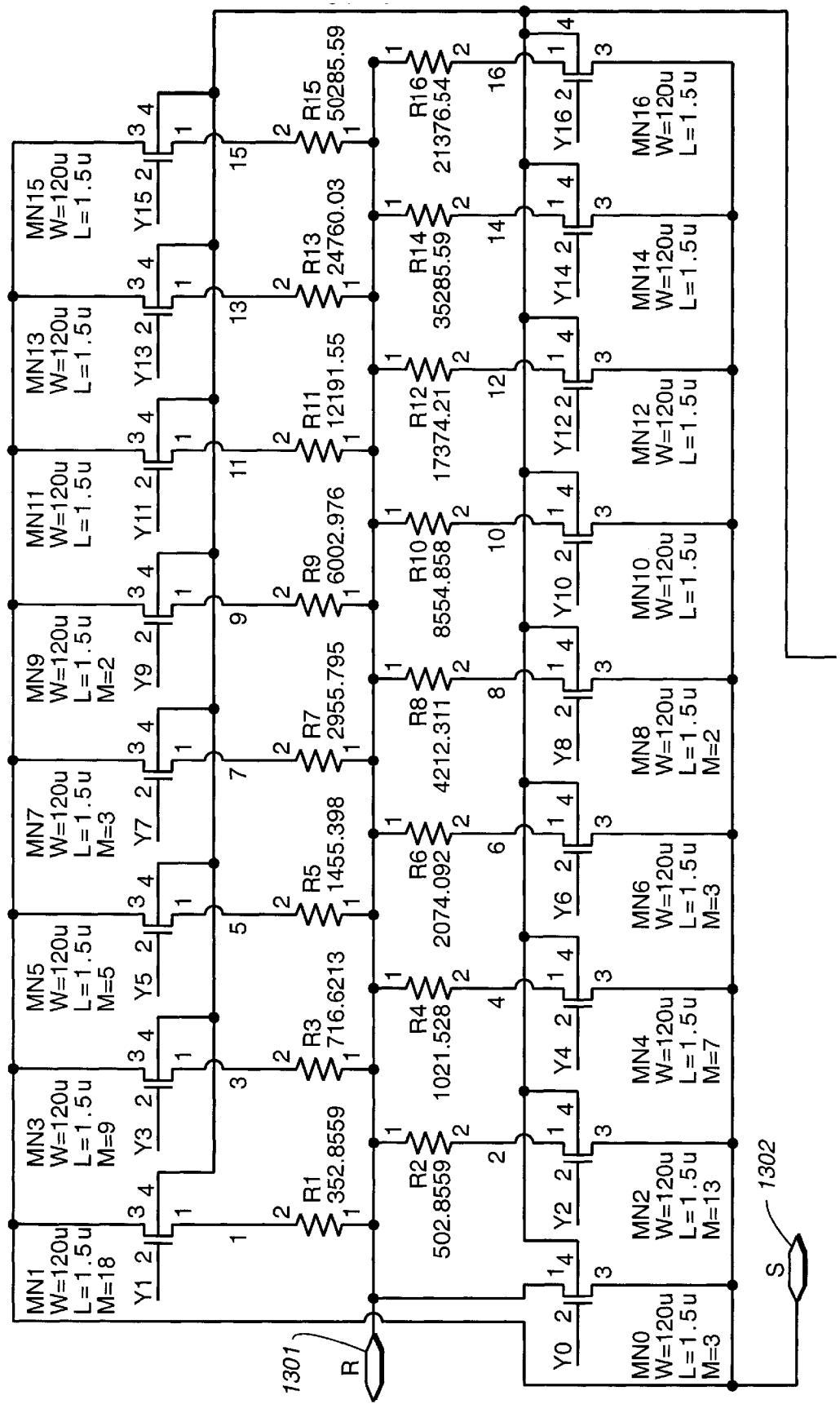
FIG._13A

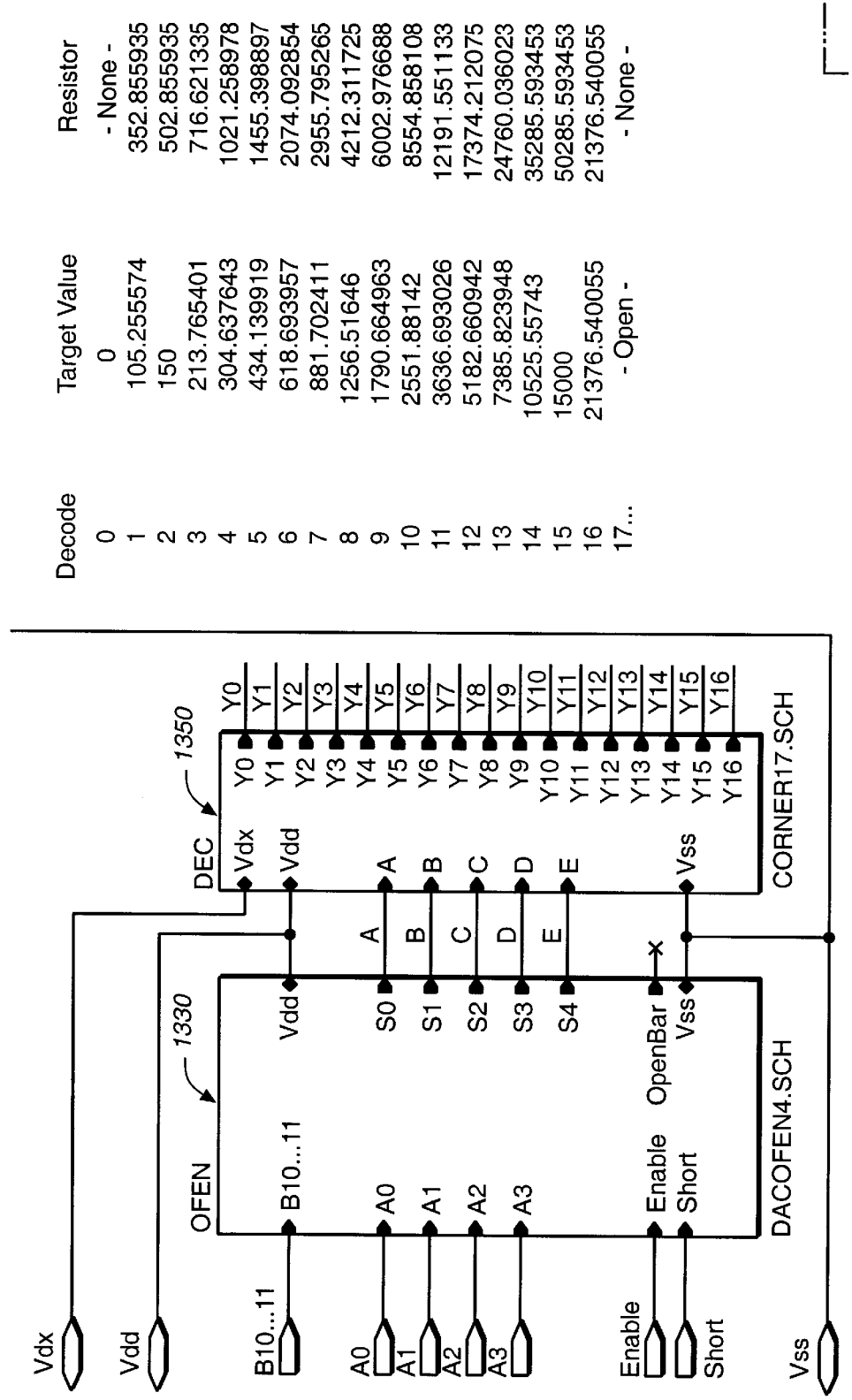
FIG._13

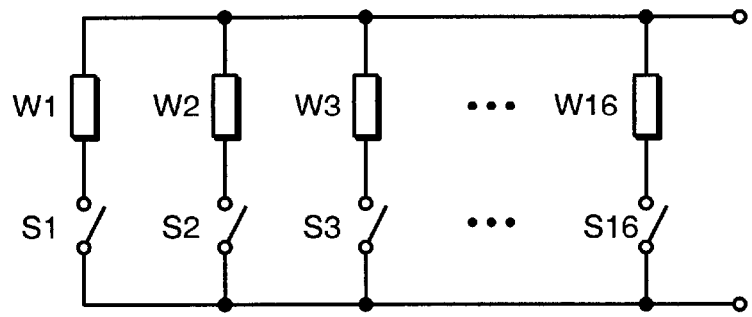
FIG._14A
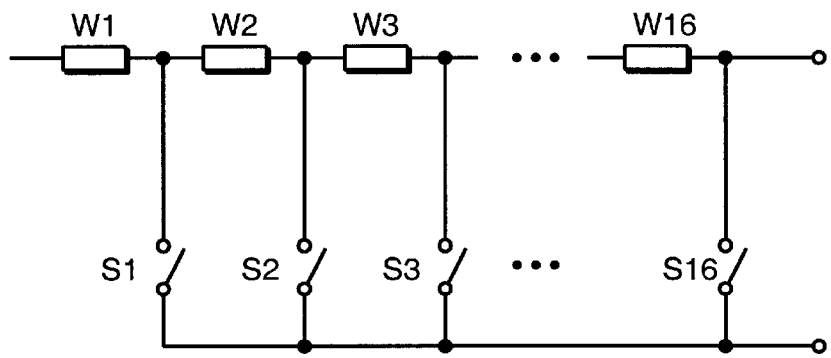
FIG._14B
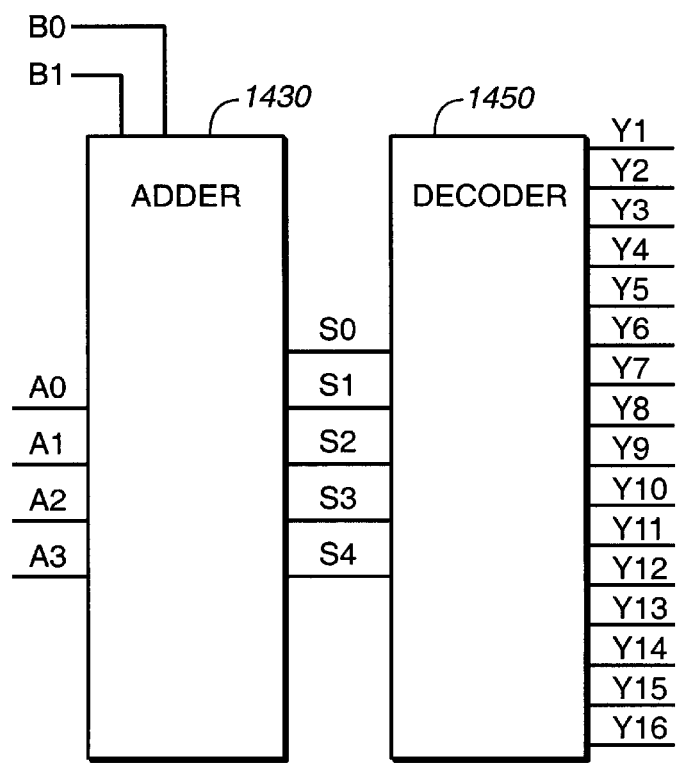
FIG._14C

DIGITAL TO ANALOG CONVERTER TRIM APPARATUS AND METHOD

FIELD OF THE INVENTION

The present invention relates generally to the trimming of a digital to analog converter to compensate for manufacturing variations in the value of the weighted analog output elements comprising the converter. More particularly, the present invention is directed to a method and apparatus for trimming a digitally programmable resistor.

BACKGROUND OF THE INVENTION

Digital-to-analog converters (DACs) produce an analog representation of a digital input code. The digital input code is typically directly input to a decoder which generates control signals to select a particular subset of a plurality of weighted analog elements that are summed to form an analog output. The configuration of weighted analog elements are commonly known as an analog network, since the analog network performs the function of converting digital control signals from the decoder into an analog output.

The analog elements of an electrical DAC is typically an electrical source such as a voltage or current source. Additionally, the analog elements of an electrical DAC may comprise a passive elements, such as resistors or capacitors configured as an analog network having an analog output that is an impedance. However, more generally a DAC includes a variety of control systems which convert a digital input code into an analog output. For example, a paint or ink color mixer that converts a digital input code into an analog colorant flow output is also a DAC. For example, the paint color mixer may have a plurality of electronically controlled valves coupling, in parallel, the colorant to a base paint. Each switchable valve may have a different maximum orifice size. A decoder may be used to select which of the valves is turned on as a function of the digital input code, thereby regulating the flow rate of a particular colorant added to the base paint. Generally speaking, a DAC may encompass any process or manufacturing method in which a digital input code may be converted into an analog output using a decoder and an analog network comprised of a plurality of switched analog network elements.

Although there are several different types of DAC, voltage converters are one of the most common types used to illustrate the general principles of DAC operation. The general principles of a DAC voltage converter are shown in FIGS. 1A–1C. In a DAC voltage converter, digital input codes are commonly converted to analog voltages by assigning a voltage weight, or a current weight, to each bit of the digital input code and summing the voltage or current weights of the entire code.

FIG. 1A shows a generalized DAC voltage converter 100, having a decoder logic 30, switches 20, analog network 40, reference source 10, and buffer amplifier 50. Decoder 30 receives a digital input code 5, typically in the form of a binary input word. The decoder 30, sometimes also called a control logic or a demultiplexer, selectively turns on and off switches 20 coupled to a analog network 40. Typically analog network 40 and decoder 30 are configured so that the analog output of analog network 40 is a linear function of the numeric value of a digital input code. However, the output of analog network 40 may also be a more complex mathematical function of a digital input code 5. Analog network 40 is commonly comprised of a resistor network in which a plurality of resistors are coupled to the network by switches 20 so that control signals from decoder 30 determine the output of analog network 40. However, analog network 40 may also be formed from a plurality of current or voltage sources. Analog network 40 is also sometimes called an analog output network, an attenuation network, or a decoding network. A reference source 10, typically a voltage source, is used so that the analog network 40 attenuates the reference source 10 according to an attenuation factor which is a function of the conductive state of switches 20. The output of the analog network 40 is typically coupled to a buffer amplifier 50. The analog output of the analog network 40 is typically plotted as a function of the digital input code, with the plot being described as the transfer function or the transfer characteristic of the DAC.

FIG. 1B is an illustrative prior art DAC voltage converter 110 with switches and resistors arranged in one common DAC voltage converter configuration. The analog network 40 and switches 20 are arranged as a parallel resistor network with each resistor connected by one switch between a reference voltage source 16 to the inverting node of an op-amp 18. Each subsequent resistor has twice the resistance of the previous resistor, thereby reducing its on-current by a factor of two. A five bit digital input code determines the switch positions of the five corresponding switches. The total current, I, of DAC 110 entering the inverting node of op-amp 18 is the sum of the binary weighted currents. The voltage, $V_{out}$, can be expressed as: $V_{out}=R_f V_{ref}$ ($b_1/2R+b_2/4R+b_3/8R+b_4/16R+b_5/32R$), where $V_{ref}$ is a reference voltage, $R_f$ is a feedback resistance 120, and $b_i$ is the $i_{th}$ bit value (zero or one). EQ. 1. This can also be expressed as: $(R_F/R\ V_{ref})B_{in}$, where $B_{in}=b_1 2^{-1}+b_2 2^{-2}+b_3 2^{-3}+b_4 2^{-4}+b_5 2^{-5}$. EQ.2.

There are several figures of merit to describe the response of a DAC. One limit to the response of DAC 110 is determined by the number of input bits. A large number of bits may permit a more accurate representation of an analog signal by allowing an analog signal to be represented with smaller step increments. The least significant bit (LSB) defines the smallest possible change in the analog output voltage. The LSB for a linear DAC is typically defined as: 1 LSB=$V_{ref}/2^N$, where $V_{ref}$ is the reference voltage and N is the number of bits. The resolution is typically described in terms of the increment of the least significant bit (LSB), which is the smallest analog signal increment which can be represented by the DAC. For a linear DAC with equal step heights (i.e., linear transfer function), the resolution, R, is given by the mathematical expression: $R=1/[2^N-1]$, where N is the number of bits. The greater the number of bits, the greater the potential resolution. However, the accuracy of a linear DAC is a function of other variables besides the number of bits. Absolute accuracy describes how close the output is to its ideal, or target value. Absolute accuracy depends upon the reference voltage and resistor tolerance. Relative accuracy refers to how close each output level is to its ideal fraction of full scale output. Relative accuracy depends principally upon on the tolerance of the weighted resistors. If the individual resistors of the analog network depart significantly from their target values the steps in the transfer function may be larger or smaller than 1 LSB. A monotonic DAC is one that produces an increase in output for each successive digital input. In order for a DAC to be monotonic the error, or differential non-linearity, must be less than ±½ LSB at each output level, which imposes tolerance requirements on the individual resistors comprising the analog network. The differential non-linearity, DNL, of a DAC is commonly expressed mathematically by: $DNL_n$=the actual increment height of transition n—the ideal increment height. Generally, a DAC must have less than ±½

LSB of DNL if it is to be N-bit accurate. The dynamic range, DR, of a DAC is commonly defined as the ratio of the largrest output signal over the smallest output signal, and for a conventional DAC is related to the resolution of the converter by the equation: DR=20 Log(full scale/LSB) dB. Other common figures of merit for a DAC include the offset, gain error (ideal slope—actual slope), and integral nonlinearity.

A drawback of the DAC converter 110 shown in FIG. 1B is that it's unsuitable for achieving a large DR. This is because conventional manufacturing processes impose significant inter-lot and lot-to-lot fabrication variances on integrated circuit resistors. The actual tolerance of the resistors is a function of their target resistance values. The converter 110 of FIG. 1B requires that the largest resistor be $2^N-1$ times larger in value than the smallest resistor. As the number of bits increases to increase the DR, the range of resistor values increases correspondingly. However, in conventional integrated circuit manufacturing processes it is difficult to achieve a tight tolerance of each resistor while also increasing the range of resistor values, i.e., the process variation affects large value resistors differently than small value resistors. One conventional approach to the resistor tolerance problem is to use resistors with almost identical characteristics arranged in a slightly more complicated decoding network. FIG. 1C shows a DAC voltage converter 120 configuration which is commonly known as an R–2R ladder architecture. This configuration uses only two values of resistance in the ladder, R and 2R, and is preferred for DACs in which the output varies over several orders of magnitude. The ladder configuration results in a sequence of impedances in parallel at each subsequent node such that the ladder circuit results in a binary division of current. It can be shown that the output voltage of the R–2R DAC is of the form Vout=Vref($R_F$/R)$\Sigma b_i/2^i$, where $R_f$ is the feedback resistance of op-amp 19, Vref is a reference voltage, and bi corresponding to the bit value (zero or one) of each switched 2R resistor of the ladder. EQ. 3. A chief advantage of the R–2R architecture is that the resistors can be fabricated with resistors having only two target values, which facilitates reducing the resistor variance, i.e., improving the tolerance compared to a configuration in which the resistor values vary over a wide range.

While the R- 2R architecture solves some of the fabrication problems of voltage converter DACs, the resistor ladder tends to occupy a large chip area when the ladder is scaled to achieve a large dynamic range. FIG. 1D is a schematic circuit diagram of a prior art programable resistor DAC 130 configured as a programmable logarithmic resistor. The analog network 40 and switches 20 are arranged as a parallel resistor network with each resistor connected by one switch to nodes R and S. Each subsequent resistor has 3.0769 decibels the resistance of the previous resistor, thereby reducing its on-current by a factor of 1.4251. A four bit digital input code determines the switch positions of the fifteen switches. FIG. 1D includes resistance values and a truth table for decoder 180. One advantage of the configuration of DAC 130 is that the value of each of the resistors increases such that a small total number of resistors may be used to select a programmable resistance over a large decibel range. However, a disadvantage of the embodiment of FIG. 1D is that it is difficult to achieve a high yield of DACs with desirable transfer characteristics. As can be seen in FIG. 1D, the target values of the resistors vary by up to a factor of seventy (i.e., from about 500 Ω to 35,000 Ω). It is very difficult to achieve a uniformly tight fabrication tolerance for resistors covering such a large range in values. The absolute value of each resistor will tend to have a significant variance from the target value (e.g., at least about 30%), depending upon the details of the fabrication process. Thus, while DAC 130 is compact, the yield of DACs having a transfer characteristic achieving desired figures of merit (e.g., absolute logarithmic linearity, logarithmic monotonicity, logarithmic dynamic range, etc.) tends to be undesirably low.

Routine fabrication variations in the resistors of a DAC voltage converter or programmable resistor may render the DAC unsuitable for its intended purpose. One way to compensate for fabrication variances in the resistance value of the resistors comprising a DAC is to mechanically trim the resistance values of the resistors comprising the DAC. In integrated circuits, individual resistor segments are sometimes trimmed using a laser beam to thin portions of a resistor by ablation (burning off) a portion of the resistor. However, trimming the resistors of an integrated circuit DAC with a laser beam can be an expensive and time consuming process because a large number of individual resistors must be trimmed at one time. It also requires a fabrication process consistent with laser ablation, i.e., fabricating metal segments designed to be thinned. Generally, conventional methods to trim the resistors of a DAC circuit increase the complexity and cost of fabricating a DAC circuit, particularly for compact integrated circuits.

One alternative to mechanically trimming the resistors of a DAC is to use a digital signal processor (DSP) to perform a calibration function. For example, a DSP may be used to performing a mapping function to compensate for a non-linearity in the transfer characteristic of a linear DAC. However, DSP circuits have limitations on the types of errors in target resistance values that they can trim. They require that a permanent memory be provided that can be programmed with extensive data on the transfer function along with signal processing circuits to perform a mapping function. Additionally, conventional DSP circuits tend to occupy a relatively large circuit area, which increases the cost of the integrated circuit. DSP circuits also consume significant amounts of power. The cost and complexity of integrating a DSP to perform a DAC trimming function is substantial. Consequently, in many applications, such as low voltage hearing aid circuits, it is impractical to use a DSP to compensate for manufacturing variations of the analog elements of the DAC.

While DAC voltage converters are one example of electronic circuits using analog networks, other electronic circuits and processes also use analog networks. Programmable resistors and programmable potentiometers are an important category of DAC. Programmable resistors and potentiometers typically use a network of resistors configured as an analog network in which a change in switch positions determines the output resistance of the analog network. Some of the individual resistors of the analog network may be out of tolerance, thereby degrading the performance of the programmable resistor. Additionally, systemic variations in lot-to-lot parameters of the resistor fabrication process may also result in a programmable resistor in which the resistance of all the resistors of the analog network are proportionately out of specification, thereby deleteriously effecting the ability of the programmable resistor to accurately convert a digital input code into the target analog resistance.

A variety of manufacturing processes also utilize switched weighted outputs configured in a manner analogous to the analog network of a digital to analog converter. The same generic problem is encountered in a variety of analog networks, namely that there is a manufacturing tolerance to the weighted analog outputs which limits the performance of the DAC.

What is desired is a new method and apparatus for reducing the effect of manufacturing variances in the weighted analog elements of an analog network on the performance of a digital to analog converter.

SUMMARY OF THE INVENTION

The present invention is directed towards improving the performance of all types of digital to analog converters (DACs). However, the method and apparatus of the present invention is particularly beneficial for DACs having a large dynamic range and a geometric progression of output values, such as a logarithmic DACs producing a current, voltage, resistance, or capacitance varying over a wide dynamic range as a function of a digital input code.

The present invention generally comprises: a first input for receiving a digital input code to be converted into an analog output; a second input for receiving an offset code; a plurality of weighted analog elements; a plurality of switches coupling said plurality of weighted analog elements into an analog network; a calibration circuit receiving the digital input code, the calibration circuit configured to produce an offset digital code as a function of the value of the offset code; and a decoder coupling switch control signals to the switches of the analog network as a logical function of the offset digital code; wherein the analog network is configured to produce an analog output that is a stepwise function of the offset digital code; and wherein the progression of the steps is selected so that a change in the value of the offset code adjusts the output of the analog network by the same factor over a predetermined range of code values of the digital input code.

A preferred embodiment of the present invention is a DAC that is a programmable logarithmic resistor. A preferred implementation of a logarithmic resistor includes an analog network which is a resistor string having a plurality of resistors connected end-to-end. A first end of the resistor string is coupled to a first output terminal. The second end of the resistor string is coupled to a second output terminal by a switch. Each resistor node between adjacent resistors is also coupled to the second output terminal by a switch. The resistance along the resistor string between adjacent nodes preferably increases by a multiplicative factor.

One object of the present invention is a digital to analog converter with reduced sensitivity to variations in lot-to-lot fabrication tolerances.

Another object of the present invention is a digital to analog converter whose output may be trimmed by programming an offset code.

Still another object of the present invention is a programmable resistor performing the function of form-C switch.

Still yet another object of the present invention is a method of programming an offset code using fuses or antifuses.

BRIEF DESCRIPTION OF THE DRAWINGS

FIG. 1A is a generalized block diagram of prior art digital to analog converter.

FIG. 1B is a circuit schematic of a first prior art digital to analog converter.

FIG. 1C is a circuit schematic of a second prior art digital to analog converter.

FIG. 1D is a circuit schematic of a third prior art digital to analog converter.

FIGS. 2A–2C are illustrative prior art circuit schematics showing applications of programmable logarithmic resistors.

FIG. 3 is an illustrative block circuit diagram of a two terminal programmable resistor of the present invention.

FIG. 4 is a circuit schematic of a preferred embodiment of the programmable resistor of FIG. 3.

FIG. 5 is a detailed circuit schematic showing a preferred implementation of the adder circuit used in FIG. 4.

FIG. 6 is a block circuit diagram of a preferred embodiment of a three terminal programmable resistor of the present invention.

FIG. 7 is a circuit schematic of a preferred adder circuit used in the programable resistor of FIG. 6.

FIG. 8 is a circuit schematic of a preferred control circuit used to define a third terminal connection to the resistor string of FIG. 6.

FIG. 9 is a circuit schematic of a preferred circuit for use in creating logical control signals for the control circuit of FIG. 8.

FIG. 10 is truth table showing logical inputs and output for the control circuit of FIG. 9.

FIG. 11 is a truth table showing input signals and the resulting third terminal connections for the circuit of FIG. 8.

FIG. 12 shows an embodiment of a preferred antifuse circuit for storing trim commands.

FIG. 13 shows an embodiment of the present invention which is implemented as a parallel circuit.

FIGS. 14A, 14B, and 14C show generalized block diagrams illustrating how the teachings of the present invention imay be practiced with a variety of weighted inputs other than electrical resistors.

DETAILED DESCRIPTION OF THE INVENTION

The present invention is generally directed towards an apparatus and method to improve the transfer characteristics of a digital to analog converter (DAC), particularly a DAC having a large dynamic range (DR). A preferred embodiment of the present invention is a DAC which is a programmable resistor suitable for use as a two-terminal logarithmic resistor, three-terminal logarithmic potentiometer, and a form-C switch. However, it will be understood that while a preferred embodiment of the present invention comprises a programmable resistor with a DAC output which is an electrical resistance, the teachings of the present invention are broadly applicable to a variety of different types of DACs which convert a digital input code into an analog output. These include DACs having analog networks formed from a plurality of weighted analog elements which are not solely resistors, such as DAC voltage or current converters having a plurality of weighted voltage or current elements. Additionally, the teachings of the present invention are also applicable to processes and manufacturing methods in which the DAC has weighted analog elements which are not resistors, voltage sources, or current sources. By way of illustration and not limitation, the weighted analog elements forming the analog network of the DAC may include switched valves or orifices regulating the quantity or flow rate of a gas, liquid, or fluid used in a process or method of manufacture.

Some of the problems solved by the preferred embodiment of the present invention are illustrated in FIGS. 2A–2C, which show prior art applications of programmable DAC resistors. FIG. 2A shows an application in which a programmable resistor performs the function of a form-C switch, i.e., toggling two switches to a common node. FIG. 2B shows an application in which a programmable resistor is used as a floating reference resistance. FIG. 2C shows an application in which several programmable resistors are coupled as a network with one terminal grounded. The functions shown in FIGS. 2A–2C are preferably integrated into one integrated circuit, since this increases the versatility of the programmable resistors.

The programmable resistor applications shown in FIGS. 2A–2C are particularly useful for hearing aid circuits, which often use programmable logarithmic resistors to control the functions of an audio circuit over a large decibel range of inputs or outputs. Logarithmic resistors are particularly useful as gain control elements and as attenuator elements. The total area of the resistors, switches, memory, and logical and control elements comprising the programmable resistors of FIGS. 2A–2C is preferably made as small as practical in order to reduce the cost of the circuit. Conventional techniques to fabricate DACs performing all of the functions shown in FIGS. 2A–2C are typically comparatively expensive because of the large chip area required to achieve a large dynamic range of output resistance. Additionally, the manufacturing yield of DACs having acceptable performance is typically lower than desired because manufacturing variations in the value of the resistors comprising the programmable resistors degrades the performance of the DAC. Moreover, increasing key figures of merit (e.g., resolution, linearity, monotonicity, dynamic range, etc.) of programmable logarithmic resistors similar to those of FIGS. 2A–2C typically results in a reduced manufacturing yield, i.e., the effect of resistor variance on performance becomes more severe.

FIG. 3 is a generalized block diagram of a first preferred embodiment of a programmable resistor circuit 300 of the present invention. Referring to FIG. 3, it is desired to convert a digital input code from a data input 320 into an analog output which is an electrical resistance. Circuit 300 has an analog network 310 with a plurality of switches, $T_i$, coupling the output of weighted value resistors $R_i$ between first and second output terminals 301, 302. Analog network 310 is configured to produce a selectable resistance as a function of switch control signals Y0, Y1 . . . YJ coupled from decoder 350. Switch control signals Y0, Y1 . . . YJ coupled from the output of decoder 350 select which of the switches T0, T1 . . . TJ conduct. For low voltage circuit applications the switches are preferably MOSFET switches, but other types of switches could also be used. Decoder 350 may be any conventional decoder circuit which performs the function of selecting switch positions based upon the value of a digital input code. However, for hearing aid circuits, decoder 350 is preferably implemented as a low voltage circuit.

The preferred embodiment of analog network 310 shown in FIG. 3 is a resistor string 315 comprised of a plurality of resistors R1, R2, . . . RJ having weighted resistance values, i.e., resistors R1, R2, . . . RJ each having a different resistance value with a value (weight) selected according to a mathematical relationship which is described below in more detail. Each individual resistor, Ri, has two ends. Resistors R1, R2, R3, . . . RJ are arranged as a resistor string 315 comprised of a series of resistors connected end-to-end between first and second end nodes, N0 and NJ, which are disposed at opposed ends of string 315. First end node N0 is electrically coupled to first output terminal 301. One switch, Ti, preferably couples each resistor node, Ni, between adjacent resistors to second output terminal 302. A switch TJ couples second end node NJ to second output terminal 302. A switch T0 is preferably included to couple first end node N0 to second output terminal 302 in order to permit the two output terminals 301, 302 to be shorted to each other. In this configuration, turning on switch T0 shorts the analog network 310; turning on only switch T1 results in an output resistance between terminals 301, 302 of R1; turning on only switch T2 results in an output resistance of R1+R2; turning on only switch Ti results in an output resistance of R1+R2+. . . Ri; and turning on only switch TJ results in an output resistance of R1+R2+R3 . . . +RJ, which is the total series resistance of all of the resistors of the resistor string 315. The analog network 310 of the preferred embodiment of FIG. 3 may be used as a digitally controlled resistor whose output resistance is a function of the conduction state (i.e., switch position) of switches T0, . . . TJ.

Additionally, if none of the switches T0, . . . TJ are turned on the output resistance between terminals 301, 302 will be extremely high (i.e., approximate an open circuit). Consequently, circuit 300 may be toggled between a low resistance and a high resistance output.

The arrangement of the resistors of the preferred embodiment of analog network 310 shown in FIG. 3 permits selecting the series resistance between Node N0 and each node Ni to be a predetermined fraction of the total series resistance of all of the resistors in string 315. Consequently, the series resistance at subsequent nodes of string 315 can be selected to obey any mathematical progression consistent with the resistance, relative to node N0, increasing with each subsequent node. This includes arithmetic and geometric progressions.

For programmable logarithmic resistor applications, a particularly useful mathematical relationship is that the series resistance at each node Ni increases by a multiplicative constant relative to a previous node Ni−1. Decoder 350 is configured to select one transistor Ti as a function of the numeric value of a digital input to the decoder 350. Increasing the numeric value of the digital input to decoder 350 increases the resistor node Ni to which second output terminal 302 is coupled to string 315. This preferred progression and decoder configuration results in an output resistance of resistor string 315 which is a stepwise function of the digital input code in which the steps progress in logarithmic increments as a function of the value of the digital input received by decoder 350.

Selecting the resistance values of resistors Ri to obey a mathematical progression permits a small number of resistors to be used to encompass a large decibel range. One advantage of the resistor string 315 configuration of analog network 310 is that it is compact compared to conventional analog networks used to cover comparable resistance ranges. For example, it uses fewer resistors than a conventional R- 2R architecture because of the progression of resistance steps, i.e., the progression of weights of the resistors permits a small total number of resistors to encompass a large dynamic range. It is also an extremely compact configuration because the series coupling of individual resistors in string 315 permits a small total number of resistors to achieve a large total resistance.

Another benefit of analog network 310 is that certain types of relative errors cancel out. In some electronic circuit applications the absolute value of resistance selected by a programable resistor as a function of digital input code is less important than the relative resistance (resistance ratio) as a function of the digital input code. For example, in some audio applications the decibel change in resistance as a function of digital input code is more important than absolute resistance values. The resistor string 315 of analog network 310 permits the resistance at different nodes to define desired ratios. For example, the ratio, $R_{ratio\ 2,3}$ of resistance at node 2 relative to node 3 is: $R_{ratio\ 2,3}=(R1+R2)/(R1+R2+R3)$. Resistor fabrication steps that result in a systemic variation of each resistor by the same percentage cancel out in the ratio.

Circuit 300 also preferably includes a calibration circuit 360 to convert an digital input code coupled by input 320 into a modified digital code input received by decoder 350 such that a calibration function is achieved. The function of calibration circuit 360 could be implemented as part of a larger decoder circuit configured so that an offset code shifts the output of the decoder. However, the inventors have recognized that a calibration function may be achieved using a comparatively simple calibration circuit 360 to offset the value of the digital code S0 . . . Si received by a conventional decoder 350.

The resistor string 315 of analog network 300 permits the implementation of an extremely compact and efficient calibration function requiring only a few additional resistors, switches, and a compact logic circuit. In a preferred embodiment, calibration circuit 360 comprises an adder 330 to add an offset value to digital input 320. The offset value is, in a preferred embodiment, entered as a bit code, such that is may also be referred to as an offset code. The offset code may be stored in a permanent memory or it may be provided by any logic and control circuit. In a preferred embodiment shown in FIG. 3. the offset code is provided by a trim control circuit 340 which generates an offset bit code B(0) . . . B(n) in response to trim commands 344, 342.

Adder 330 performs the function of summing the value of the offset code with the digital input code. This operation is preferably performed as a two's complement summation. Adder 330 may be any conventional digital adder circuit. Adder circuits are configured to digitally add two or more inputs together to produce an output which is a digital sum of the inputs. As used in this application, an adder also includes an adder-subtractor which subtracts one digital input from another. Adder 330 adds offset code B0, B1 with the digital input code A0 . . . Am received at input 320. This results in an offset digital code S0, S1 . . . Si. The integer value of the offset code preferably comprises a small range of integer values (e.g., 0, 1, 2) but could encompass a wider range. A non-zero value of the offset code results in decoder 350 selecting a higher value node. Ni, of the resistor network for the same digital input code A0, A1 . . . Am.

The resistance of resistor string 310 at each node Ni is preferably selected to be a multiplicative constant, y, of the resistance at node Ni-1. Consequently, an offset code which results in turning on switch $T_{i+1}$ instead of switch $T_i$ increases the output resistance by the factor y. Conversely, an offset code that results in turning on switch $T_{i-1}$ instead of switch $T_i$ reduces the output resistance by the factor y. Adding (or subtracting) a small offset code with a small integer value in adder 330 to the digital input code results in an output of resistor network 310 that is scaled by a multiplicative constant. Mathematically, this can be expressed as: $y^{(m+n)}=y^n \times y^m$, where m is the value of the original digital input code 320 and n is the integer value of the offset code. A systemic variation in the value of all of the resistors thus results in an output resistance, R, of: $R=R_{1,target}(1\pm\Delta) y^{m+n}$, where $R_{1,target}$ is a nominal target resistance of resistor R1 and $\Delta$ is a small percentage variation in nominal resistance of each of the resistors comprising resistor network 310. This can be re-written as: $R=R_{1,target}[(1\pm\Delta) y^n]y^m$. As an illustrative example, if resistor string 315 is selected so that the series resistance of subsequent nodes, Ni, increases by a factor of 1.4 (i.e., y=1.4), then adding an integer n=1 to the input code in adder 330 shifts the output response by a factor of 1.4. Suppose that there is systemic variance in the value of the resistors. The integer value of the offset code, n, may be selected to counteract part of the effect of systemic lot-to-lot resistor variance. For example, if all of the resistors are 30% lower than their target v alue and y=1.4, then selecting n=1 acts to trim the analog network 310 as if the resistors were within 2% of true value (i.e., 0.7×1.4=0.98). Trimming down the analog network is also possible by arranging a "normal" non-zero offset so that a low or zero offset value, n, has the effect of trimming down the analog network. For example, the "normal" or no-correction signal may be n=1, such that n=0 trims down and n=2 trims up.

The analog network 310 and calibration circuit 360 of the present invention permits an untrimmed DAC with an error within ±1.5 LSB caused by a systemic variance in resistor tolerance to be trimmed to within ±0.5 LSB by inputting an offset code. This post fabrication calibration function greatly improves the effective lot-to-lot yield of analog network 310. Moreover, in a preferred embodiment, it requires only two additional resistors in string 315 to permit both a trim up and a trim down function.

Trim control circuit 340 preferable converts trim input signals 341, 342 into a digital offset code (e.g., a code with a numeric value of 0, 1, 2, 3, . . . ) input to adder 330. FIG. 3 shows two trim commands 342 and 344 corresponding to a trim up input 344 and a trim down input 342. Trim control circuit 340 may be any logic and control circuit or memory which may be programmed to produce an offset code B0, B1 as a function of trim up or trim down commands. A preferred embodiment of a trim control circuit 340 uses a logic circuit to produce an offset code B0, B1 as a function of trim commands 342, 344 stored as the conduction state of one or more fuses or antifuses. As used in this application, a fuse is any element, such as metal film or semiconductor element, which is switched to a non-conducting state by the application of a high voltage or current. Compact fusible links are commonly used in programmable logic structures. An antifuse is a structure which when programmed with a high voltage is changed permanently to a low resistance structure. Antifuses are typically comprised of a sandwich of polysilicon and oxide layers. They are compact elements used in programable link logic. However, more generally the offset code input to adder 330 could be generated by any circuit configured to produce a digital offset code in response to an analog or digital trim control signal.

FIG. 4 shows an embodiment of a DAC programmable resistor circuit 400 with an output resistance between output terminals 401, 402 which has a target range of 300 kiloohms. It has a four bit digital input code A0, A1, A2, and A3 received at input 420 and a two bit offset code B0, B1 received at input 425. The digital input code and offset code are summed in adder 430. This results in a five bit offset digital input code S0, S1, S2, S3, S4 received by decoder 450. Decoder 450 has 17 outputs Y0, Y2, . . . Y16 for controlling switches MN0, MN1, . . . MN16. Switch MN0 is configured to short the resistor network. There are 16 resistors, R1, R2, . . . R16 connected end-to-end as a resistor string 415 with one switch, MNi, coupling each resistor node, Ni, between the resistors and the two end nodes N0, N16 of resistor string 415 to second output terminal 402. The values of the resistors R1 to R16 are also shown in FIG. 4. The resistance value of each resistor R1, R2 . . . R16 is selected so that the total series resistance of subsequent resistor nodes, Ni, along resistor string 415 increases by a factor of 1.425.

FIG. 5 shows a circuit schematic of a preferred adder circuit 430 for use with circuit 400. The general principles of adder circuits are well known by those of ordinary skill in the art and do not need to be described in detail. However, one aspect of the present invention is that circuit 400 preferably provides a short and open function in addition to a plurality of resistance steps. Consequently, adder 430 preferably includes enable and short input terminals 430, 435 coupled by logic gates 470 configured so that adder 430 produces codes for shorting and opening decoding network 410 which are independent of the value of the offset code. As illustrative examples, adder 430 is preferably configured to permit the binary digital input code of 0000 to always short the resistor string and a binary digital input code of 1111 to always open the resistor string regardless of the numeric value of the offset code. This requires additional logical circuitry 470, as shown in FIG. 5, so that a logical input to the short or enable terminals results in a digital code S0, S1, S2, S3, S4 received by decoder 450 which is independent of the offset code.

Table I is a table showing the target resistance of programmable resistor 400 as a finction of the digital input code. The relative resistance, compared to the maximum target resistance, is also shown in Table I as a function of the digital input code. As can be seen in Table I, the digital input code permits fourteen resistance steps to be selected. Two digital input bit codes are reserved for a short code, and an open code. The resistance value of the resistors are selected so that the resistance may be stepped in increments slightly larger than 3 dB relative to a maximum target value of 300 kilo-Ohms. Note that the resistor string has a total of sixteen resistors whereas there are only fourteen steps to the output resistance. If DAC 400, as fabricated, has resistors which are systemically too large or too small in value, the value of the offset code may be adjusted to shift up or down the output resistance for all digital input codes within the range of the fourteen codes corresponding to resistance selection which is not a short or an open circuit. As an illustrative example, if a target resistance of 300 kilo-ohms is a desired, Table I indicates that a binary input code of 1110, having a numerical value of 14, in input as the digital input code. If the resistors were fabricated perfectly without any variance, the total series resistance at node 15 would be 300,000 ohms such that node 15 would be selected by decoder 450. This requires a default value of the offset code having a value of one. In a preferred embodiment, an offset code with a value of zero results in decoder 450 turning on switch 14 (total target series resistance at node 14 of 210,511 ohms); an offset code with a value of one results in decoder 450 turning on switch 15 (total target series resistance at node 15 of 300,000 ohms); and an offset code with a value of two results in decoder 450 turning on switch 16 (total target series resistance at node 16 of 427,530 ohms). It can be seen that an offset code of zero acts to reduce the output resistance by a factor of 1.425 whereas an offset code of 2 acts to increase the output resistance by a factor of 1.425. Consequently, the offset code may be used to calibrate the absolute value of the output resistance to bring the transfer function of circuit 400 closer to the target values shown in Table I.

TABLE I

Digital input codes and target resistance values for circuit 400.

| Binary Digital Input Code | Value re Rmax (dBΩ) | Target Resistance, KΩ |
|---|---|---|
| 1111 | open | open |
| 1110 | 0 | 300 |
| 1101 | −3.1 | 210 |
| 1100 | −6.2 | 150 |
| 1011 | −9.2 | 100 |
| 1010 | −12.3 | 73 |
| 1001 | −15.4 | 51 |
| 1000 | −18.5 | 36 |
| 0111 | −21.5 | 25 |
| 0110 | −24.6 | 18 |
| 0101 | −27.7 | 12 |
| 0100 | −30.8 | 8.7 |
| 0011 | −33.8 | 6.1 |
| 0010 | −36.9 | 4.3 |
| 0001 | −40 | 3.0 |
| 0000 | short | short |

FIG. 4 also shows decoder 450 provided with a voltage input $V_{dx}$. For low voltage hearing aid applications, such as hearing aids, a voltage multiplied signal $V_{dx}$ is preferably used to drive the gate voltages of switches MN0, MN1, . . . MN16 to reduce their on-resistance. As is well known in the low voltage circuit art, the gate voltage of MOSFET switches is preferably increased sufficiently to drive the switches well into the ohmic region. A variety of voltage multiplication circuits, such as charge pump circuits, are known in the field of low voltage circuit design. However, a preferred voltage multiplication circuit is described in U.S. Pat. Ser. No. 09/149,927 entitled, "Battery Polarity Insensitive Integrated Circuit Amplifier," which is owned by the assignee of the present invention. The teachings of U.S. Pat. Ser. No. 09/149,927 are hereby incorporated by reference.

FIG, 6 shows a preferred embodiment of a three terminal programmable resistor circuit 600 with an analog network 610 having thirty-two resistors R1 to R32 coupled end to end as a resistor string 615. A first "low" output terminal 601, "L" is connected to the first end node, N0, of the resistor string, which corresponds to the free end of resistor R1. A second switch selected output terminal 602, "S" is coupled to the second end node, N32, of the resistor string 615 by switch MN32. A third output terminal 603 permits a third connection to be made to resistor string 615. There are thirty-one resistor nodes N1–N31 between each of the thirty-two resistors. Each resistor node is coupled by one of the thirty-three switches, MN1 to MN33 to second output terminal 602. As in circuit 400, a switch MN0 is preferably included to permit the analog network to be shorted (i.e. provide a low output resistance). Unlike the embodiment of circuit 400, additional circuitry is included to permit a third electrical connection to be established from output terminal 603 to the free end of resistor R32 at node N32 or to resistor nodes N30 or N31 proximate resistor R32.

Adder 640 adds a two bit offset code to a five-bit digital input code to produce a six bit digital code received by decoder 630. A circuit schematic of a preferred adder circuit is shown in FIG. 7. The operation of adder 630 is similar to that of adder 430 except that adder 630 is configured to receive a five bit digital input code and produce a six bit output code. Decoder 630 is configured to turn on one of the switches, MN1–MN32, as a function of the numerical value of the digital input S0, S1 . . . S5 to decoder 630 so that offsetting the digital input code acts to shift which resistor node, Ni, is coupled between low and selected output terminals 601, 602. The preferred embodiment of analog network 610 has the resistance of resistors R1–R32 selected so that the series resistance along the resistor string 615 increases between subsequent resistor nodes, Ni, by a factor of 1.2589. Consequently, a one bit shift in the offset code shifts the output resistance between terminals 601, 602 selected by decoder 630 by a factor of 1.2589 for all digital input codes within the range of digital input codes corresponding to a logarithmic resistance step. The embodiment of FIG. 6 may be used in several different ways and may be used as a two terminal, or three terminal programmable resistor.

Table II shows the target resistance as a function of the digital input code for circuit 600 when it is used as a two-terminal logarithmic resistor. The relative resistance compared to the target resistance is also shown in dB. Digital bit input codes 00000 and 11111 are included corresponding to a short and open command, respectively.

TABLE II

Digital input codes and target resistances for circuit 600

| Binary Digital Input Code | Low to Selected Value re Rmax, dBΩ | Target resistance KΩ |
| --- | --- | --- |
| 11111 | open | open |
| 11110 | 0 | 1000 |
| 11101 | −2 | 790 |
| 11100 | −4 | 630 |
| 11011 | −6 | 500 |
| 11010 | −8 | 400 |
| 11001 | −10 | 320 |
| 11000 | −12 | 250 |
| 10111 | −14 | 200 |
| 10110 | −16 | 160 |
| 10101 | −18 | 130 |
| 10100 | −20 | 100 |
| 10011 | −22 | 79 |
| 10010 | −24 | 63 |
| 10001 | −26 | 50 |
| 10000 | −28 | 40 |
| 01111 | −30 | 32 |
| 01110 | −32 | 25 |
| 01101 | −34 | 20 |
| 01100 | −36 | 16 |
| 01011 | −38 | 13 |
| 01010 | −40 | 10 |
| 01001 | −42 | 7.9 |
| 01000 | −44 | 6.3 |
| 00111 | −46 | 5.0 |
| 00110 | −48 | 4.0 |
| 00101 | −50 | 3.2 |
| 00100 | −52 | 2.5 |
| 00011 | −54 | 2.0 |
| 00010 | −56 | 1.6 |
| 00001 | −58 | 1.3 |
| 00000 | short | short |

As previously discussed in regards to circuit 400, the offset code of the present invention shifts the absolute resistance selected by the decoder. However, in some applications, such as a three terminal voltage divider, it is also desirable to have an output resistance, for each digital input code, whose value, relative to the maximum series resistance of the resistor string, is independent of the offset code. For example, in a voltage divider configuration, output terminal 601 may be coupled to a low potential whereas output terminal 603 is coupled to a high potential so that the voltage at output terminal 602 is a fraction of the total voltage applied across resistor string 615. Shifting the tap point of the voltage divider with an offset code would, without additional circuitry, result in a change in the voltage division. A resistor string normalization control circuit 650 is preferably included to adjust the total effective length of the resistor string as a function of the offset code. Resistor string normalization control circuit 650 is configured to permit the high potential node to be defined by selecting which nodes of the resistor string are coupled to third output terminal 603. In a preferred embodiment control circuit 650 has outputs Top, First, and Second connected respectively to node N32 at the free end of resistor 32, node N31 between resistors 32 and 31, and node N30 between resistors 30 and 31, i.e., control circuit 650 permits the high potential end of the resistor string to be defined as a function of the offset code. Control circuit 650 adjusts the coupling of a third "high" output terminal 603, H, to outputs Top, First, and Second as a function of the value of logical inputs HG (0 . . . 2). Logical inputs HG(0, . . . 2) are a function of the digital offset code B0, B1 so that a change in the digital offset code also determines the high potential node proximate the second end node of string 615.

FIG. 8 is a circuit schematic of a preferred circuit to implement the function of resistor string normalization control circuit 650. Transistor switches MN0, MN1, MN2, and MN3 of circuit 650 are configured to permit a terminal H (high pad) to be coupled to a pad S; to a Top pad; to a Top pad and a First pad; or to a Top pad, a First Pad, and a Second pad as a function of logical inputs HG(0, . . . 2), and permit an open command input to decouple terminal H from resistor string 615. The output "Top" is connected to the free end of resistor 32 at node N32 (i.e., the maximum resistance is the series resistance of all 32 resistors). The output "First" is connected to node N31 between resistor 32 and resistor 31 of string 615. The output "Second" is connected to resistor nodle N30 between resistor 31 and resistor 30 of resistor string 615. FIG. 9 shows a trim control circuit 940 to produce logical outputs HG (0, . . . 2) and an offset code B0, B1 as a function of logical trim up and trim down signals 942, 944. These inputs are preferably input by changing the conduction state of fuses or anti-fuses. The circuits of both FIGS. 8 and 9 use a voltage boosted signal Vdx to increase the gate voltage of low voltage transistor switches in order to reduce their on-resistance. The boost control signal is a logical one if any output of the DAC is enabled and is a logical zero when it is shut down.

FIG. 10 is a truth table showing logical inputs and outputs for the circuit of FIG. 9. Logical inputs OffU and OffD correspond to the logical inputs to terminals 944 and 942, respectively. These inputs are preferably input by changing the conduction state of fuses or anti-fuses. Referring to FIG. 10, the shift output column corresponds to the offset shift code (value). A binary logical input of "00" corresponds to a default input, i.e., no trimming, resulting in a default offset code with a value of 1. Inputting a logical one only to terminal 942 (binary "01") results in an offset code of with a value of zero, corresponding to trimming down the decoding network 610, thereby reducing the absolute output resistance for a given digital input code. Inputting a logical one only to terminal 944 (binary code "10") results in an offset value of 2, corresponding to trimming up the decoding network 610, thereby increasing the absolute output resistance for a given digital input code. Note that inputting a logical one to both terminals 942, 944 (binary code "11") produces an offset code with a value of 1, the default value (no trim). In the context of trim up and trim down logical inputs stored as irreversible fuse or antifuse conduction states, if a trim correction up or down (i.e., a "01" or "10" binary input) proves to be too large a correction it may be negated by inputting both trim up and trim down commands (i.e, a "11" binary input) by changing the conduction state of both of the fuses or antifuses. FIG. 11 is a truth table showing the connection of the H-terminal to Top, First, Second, and S terminals of the control circuit of FIG. 8 as a function of logical inputs HG0, HG1, G2, and G3. FIG. 12 is circuit schematic of a preferred antifuse circuit for programming a trim up or trim down logical input.

The required on-resistance of the switching transistors of the present invention depends upon the resistance which the switch couples. A low value resistance typically requires a switch with a low on-resistance. In a DAC with a large DR the preferred size of the switches (e.g., gate width) may be varied. It will thus be understood that the transistor switches coupling the high or "H" output may be made smaller (i.e., have a higher on-resistance) than transistors coupling a smaller value resistance. This is desirable in order to reduce the total area of the circuit. It will also be understood that the priniciple of symmetry applies in the arrangement of circuit 600 such that the previously described resistor string normalization control circuit 650 may be coupled to either end of resistor string 615.

An embodiment of circuit 600 has a measured absolute linearity of less than ±1.5 dB, a differential linearity of ±1.5 dB, a short resistance of less than 500 Ω, and an open resistance of greater than 3 MΩ. A less than ±15% absolute accuracy in output resistance is achieved with up to a ±25% resistor tolerance by the use of the offset code. Thus, the present invention permits a logarithmic programmable resistor to be achieved with a high yield in spite of substantial fabrication variance in the resistors comprising the analog network 610.

The fabrication processes used to form the resistors of the analog network are conventional and similar to those used in conventional DACs in respect to the basic fabrication processes used to form thin film integrated resistors. However, the layout of the resistors is distinguishable in that it improves the likelihood that each resistor, regardless of target value, has about the same percentage variation in target characteristics in one lot. The resistance of an integrated circuit resistor depends upon its resistivity, cross-sectional area for current flow, and length and can be mathematically expressed by the equation $R=\rho L/tW$, where p is the specific resistivity of the material, L is the length of the resistor, t is the thickness of the resistor, and W is the width of the resistor. In order to achieve a large range of resistor values in one circuit in a conventional DAC, the dimensions of high and low value resistors are varied, i.e., high value resistors have a longer length and a shorter width compared with low value resistors. Fabrication variances, however, will cause variations in the target lengths and widths of resistors. For example, there may be an average lot-to-lot variance on the order of one micron in the length and width of a resistor caused by the combined variance in photolithography masking, and diffusion processes used to form the resistor. This normally results in the smallest area resistors having the largest percentage variance in resistance. However, in the present invention, each resistor is composed of unit cell resistors. The unit cell resistor has a standard width and a standard length. The unit cell resistor preferably has a resistance at least as large as the largest resistor in the programmable resistor. To achieve a low value resistor a plurality of unit cell resistors are coupled in parallel. Each unit cell will vary in length and width by the same percentage as a function of fabrication variances in the photolithographic masking and diffusion processes. Consequently, a resistor comprised of a single unit cell will change in value by the same percentage as one comprised of one hundred unit cells coupled as a parallel resistor. For example, using the above-described layout a 1 KΩ resistor will vary lot-to-lot from its target resistance by about the same percentage as a 100 KΩ resistor.

The three terminal DAC embodiment described may be employed as what is commonly known as a "Form C" switch. A Form C switch is a three terminal device which has two states: 1) an "open" state, wherein, the "common" terminal is shorted to a "normally closed" terminal while the "normally open" terminal is disconnected from the common terminal; and 2) a "shorted" state wherein the normally open terminal is shorted to the common terminal and the normally closed terminal is disconnected from the common terminal. In an alternate embodiment mimicking a Form C switch, the common terminal may be the switch selected. "S" output, the normally open terminal may be the High, "H", output, and the normally closed terminal may be the Low, "L", output. The two states are the open and short input codes on Table II. Thus, the DAC can mimic the function of the Form C switch. In the "SHORT" state of the Form C switch, the S output (common terminal 602) must be coupled only to the L output (output terminal 601) in response to a "short" digital input code. Simultaneously, the H output (terminal 603) must be decoupled front the resistor string 615. In the "OPEN" state, the S output (terminal 602) must be only shorted to the H output (terminal 603) in response to an "open" digital input code. Simultaneously, the L output terminal (terminal 601) must be decoupled from the resistor string. Referring, to FIG. 8, it can be seen that the transistor MN3 may be configured to permit terminal H to be coupled to terminal S in the OPEN state. Additionally, transistors MN0, MN1, and MN2 must be configured to decouple the resistor string.

While the present invention has been discussed with particularity in regards to an analog network which is a series string of resistors, it may also be implemented as a parallel circuit. As is well known, series circuits generally have a parallel circuit equivalent. FIG. 13 shows a parallel resistor embodiment of an analog network having a parallel arrangement of 16 resistors, R1, P2 . . . R16 coupled by 16 switches MN0, MN1, . . . MN16 to output terminals 1301, 1302. Decoder 1350 may be configured to turn on only one switch at a time. However, a preferred configuration is for decoder 1350 to select parallel resistance paths thereby increasing the number of parallel conduction paths to reduce the total output resistance. The total parallel resistance may be selected to obey a mathematical progression in a manner analogous to that of a resistor string. FIG. 13 shows preferred resistance values for the 16 resistors along with target output resistances to realize a logarithmic resistor with a target range of 15 kΩ. Generally, the present invention includes any parallel resistor implementation of an analog network in which the output resistance is a mathematical progression as a function of the value of digital input received by the decoder. In a preferred embodiment of an analog network implemented as a parallel circuit, the progression is selected so that the output resistance varies in steps by a multiplicative constant for an integer change in the value of the digital input received by the decoder.

Additionally, the present invention may be practiced using, a variety of weighted analog, elements other than electrical resistors. FIG. 14(*a*) shows a generalized parallel circuit with 16 parallel weighted analog elements Wi coupled by 16 switches Si into a parallel analog network. Adder 1430, FIG. 14(*c*) produces an offset digital input code S0, S1, S2, S3, S4 which adjusts which switch decoder 1450 selects. FIG. 14(*b*) shows a generalized series circuit with a series connection of 16 weighted analog elements Wi and 16 switches Si coupled as a series analog network. The weighted elements of FIG. 14(a) may comprise voltage sources or current sources. The weighted elements of FIG. 14(b) may comprise voltage sources. Additionally, the weighited analog elements may comprise other electrical elements, such as inductors or capacitors. Embodiments of the present invention using, inductors, capacitors, current sources, or voltage sources as the weig,hted analog, elements are also preferably fabricated from unit cells of constant area, coupled in parallel as required, in order to reduce fabrication variance in an analogous manner to what is described above for the preferred layout of electrical resistors.

Moreover, the present invention may also be practiced with other types of weighted analog elements besides electrical resistors, current sources, or voltage sources. It is well known that there are mechanical elements which function analogously to electrical elements and circuits. As one example, the concepts of fluid pressure, fluid resistance, and fluid flow may be analogized to the electrical concepts of voltage, electrical resistance, and current flow. For example, some manufacturing processes vary the flow rate of essential components over a wide range of values. The weighted analog elements shown in FIG. 14(a) could, for example, comprise electronic valves with a different maximum orifice diameter in order to regulate the flow of a liquid, gas, fluid, or fine powder at different weighted rates. Alternately, the weighted analog elements in FIG. 14(b) could be constrictions of different sizes which determine the mechanical resistance of a gas, fluid, or liquid through a pipe or passage.

There are also optical elements that behave in an analogous fashion to electrical elements in some applications. For example, some lighting and heating systems which convert a digital input to an analog optical or infrared output may also comprise weighted analog elements, such as an arrangement of shuttered lamps of different intensity for producing a digitally controlled light output.

For the case of a DAC with an analog network comprised of analog elements producing a mechanical or optical output, the switches may include any device which performs a selection function, such as a mechanical switch, electromechanical actuator, shutter, gate, valve, or other mechanical, electromechanical, or electrical elements which are used to perform the function of selecting an analog element. Consequently, as used in this application the term "switch" broadly includes a variety of selection devices which may be used to couple or decouple the output of an analog element to an analog network.

Although a preferred embodiment of the present invention and modifications thereof have been described in detail herein, it is to be understood that this invention is not limited to those precise embodiments and modifications, and that other modifications and variations may be affected by one of ordinary skill in the art without departing from the spirit and scope of the invention as defined in the appended claims.

What is claimed is:

1. A digital to analog converter with a trim function, comprising:
   a) a first input for receiving a digital input code;
   b) a second input for receiving an offset code;
   c) a plurality of weighted analog elements;
   d) a plurality of switches coupling said plurality of weighted analog elements into an analog network;
   e) a calibration circuit receiving said digital input code and configured to output an offset digital code that is shifted in value as a function of said offset code; and
   f) a decoder coupling switch control signals to said switches of said analog network as a logical function of said offset digital code;
   wherein said analog network is configured to produce an analog output that is a stepwise function of said offset digital code; and wherein the progression of said steps is selected so that a change in said offset code adjusts the output of said analog network by the same factor over a predetermined range of code values of the digital input code.

2. The converter of claim 1, wherein said analog network is configured to produce an output which is a geometric or logarithmic function of said offset digital code.

3. The converter of claim 1, wherein said offset code is stored in a memory.

4. The converter of claim 1 wherein each of said plurality of analog elements is selected from the group consisting of resistors, current sources, voltage sources, inductors, and capacitors.

5. The converter of claim 1, wherein said analog elements are resistors having weighted resistance values.

6. The converter of claim 5, wherein said analog network comprises:
   a plurality of resistors coupled end-to-end to form a resistor string having first and second end nodes at opposed ends of said resistor string and a resistor node between each said resistor, said first end node of said string coupled to a first output terminal and at least one switch separately coupling each of said resistor nodes and said second end node to a second output terminal.

7. The converter of claim 6, having said first end node of said resistor string coupled to a first output terminal and at least one switch separately coupling each of said resistor nodes to a second output terminal and a said second end of said resistor strinig coupled to a third output terminal.

8. The converter of claim 7, further comprising: at least two switches configured to permit the converter to function as a Form C switch in response to digital input codes corresponding to open and short commands.

9. The converter of claim 6, wherein the series resistance of said string between said first end node and subsequent nodes of said resistor string increases by a multiplicative constant at each subsequent node.

10. The converter of claim 9, wherein said decoder is configured to turn on at least one of said switches to select an output resistance.

11. The converter of claim 9, further comprising a switch coupling said first end node to said second output terminal.

12. The converter of claim 9, further comprising a control circuit to form a third terminal connection to at least one of said nodes proximate the second end node of said resistor string.

13. The converter of claim 12, wherein said control circuit is configured to adjust the coupling of said third terminal connection to said resistor string so that the output resistance as a fraction of the maximum string resistance between the first output terminal and the third terminal connection is independent of the value of the offset code.

14. A digital to analog converter for converting a digital input code into a programmable resistance, comprising:
   a) a plurality of weighted resistors;
   b) a plurality of switches configured to couple said plurality of weighted resistors into an analog network;
   c) an input for receiving an offset code;
   d) an adder for summing the value of said offset code with the digital input code to produce an offset digital code; and e) a decoder coupling switch control signals to said switches of said analog network as a logical function of said offset digital code;

wherein said analog network is configured to produce an electrical output resistance that is a stepwise function of said offset digital code; and whereby the progression of said steps is selected so that a change in the value of said offset code adjust the output resistance of said analog network by the same factor over a predetermined range of values of the digital input code.

15. The converter of claim 14, wherein said offset code is stored in a memory.

16. The converter of claim 14, wherein said analog network comprises:

a plurality of resistors coupled end-to-end to form a resistor string having first and second end nodes at opposed ends of said resistor string and a resistor node between each said resistor, said first end node of said string coupled to a first output terminal and at least one switch separately coupling each of said resistor nodes and said second end node to a second output terminal.

17. The converter of claim 16, wherein the series resistance of said resistor string between said first end node and subsequent nodes of said resistor string increases by a multiplicative factor at each subsequent node.

18. The converter of claim 17, wherein said decoder is configured to turn on at least one of said switches to select an output resistance.

19. The converter of claim 16, further comprising a switch coupling said first end node to said second output terminal.

20. The converter of claim 16, further comprising a control circuit to form a third terminal connection to a node proximate the second end node of said resistor string as a function of the value of said offset code.

21. The converter of claim 14, wherein said analog network comprises:

a plurality of resistors coupled end-to-end to form a resistor string having first and second end nodes at opposed ends of said resistor string and a resistor node between each said resistor, said first end node of said string coupled to a first output terminal, at least one switch separately coupling each of said resistor nodes to a second output terminal, and at least one switch coupling said second end of said resistor string to it third output terminal.

22. The converter of claim 21, further comprising: at least two switches configured to permit the converter to function as a Form C switch in response to digital input codes corresponding to open and short commands.

23. The converter of claim 14, wherein said resistors are coupled in parallel via said plurality of switches.

24. A digital to analog converter for converting a digital input code into an electrical resistance, comprising:

a) a plurality of weighted resistors coupled end-to-enld as a resistor string having a first end node and a second end node at opposed ends of said resistor string with one resistor node between each of the coupled resistors;

b) a first output terminal coupled to said first end node;

c) a plurality of switches coupling each of said resistor nodes and said second end node to a second output terminal;

d) a memory for storing an offset code;

e) an adder for summing the value of said offset code with the digital input code to produce an offset digital code; and f) a decoder coupling switch control signals to said switches of said resistor string as a logical function of said offset digital code;

wherein the resistance values of said resistors comprising said resistor string have a weight that increases by a multiplicative factor at subsequent resistor nodes of said resistor string so that a change in the value of said offset code adjusts the output resistance between said first and second output terminals by the same factor over a predetermined range of values of the digital input code.

25. A method of trimming a digital to analog converter converting a digital input code to an analog output, comprising the steps of:

(a) providing a digital to analog converter having an analog network configured to produce an analog output that is a stepwise function of an offset digital input code received by a decoder, the offset digital input code being produced by a calibration circuit shifting the original digital input code as a function of an offset code; and (b) selecting the offset code to trim the output of the digital to analog converter, wherein the progression of the steps of said analog network is selected so that a shift in the value of the digital input code adjusts the output of said analog network by the same factor over a predetermine range of values of the digital input code thereby trimming said digital to analog converter.

26. The method of claim 25, further comprising the step of storing the offset code.

27. The method of claim 26, wherein the step of storing the offset code is performed by changing the conduction state of at least one electronic element selected from the group consisting of fuses and antifuses.

28. A method of trimming a digital to analog converter, comprising the steps of:

(a) providing a digital to analog converter having an analog network configured to produce an analog output that is a stepwise function of a digital input code received by a decoder;

(b) providing a calibration circuit to shift the value of the digital input code decoded by the decoder by an offset code; and (c) selecting the offset code to trim the output of the digital to analog converter;

wherein the progression of the steps of said analog network is selected so that a shift in the value of the digital input code adjusts the output of said analog network by the same factor over a predetermined range of values of the digital input code, thereby trimming said digital to analog converter.

* * * * *